(12) United States Patent
Kim et al.

(10) Patent No.: US 8,107,308 B2
(45) Date of Patent: Jan. 31, 2012

(54) SEMICONDUCTOR MEMORY DEVICE

(75) Inventors: Myeong-O Kim, Suwon-si (KR); Jae-Won Ko, Busan (KR); Reum Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 199 days.

(21) Appl. No.: 12/686,176

(22) Filed: Jan. 12, 2010

(65) Prior Publication Data

US 2010/0177582 A1  Jul. 15, 2010

(30) Foreign Application Priority Data

Jan. 13, 2009  (KR) .................. 10-2009-0002680
Jun. 11, 2009  (KR) .................. 10-2009-0051996

(51) Int. Cl.
*G11C 7/06* (2006.01)
*G11C 8/10* (2006.01)
(52) U.S. Cl. .................. 365/207; 365/190; 365/230.06
(58) Field of Classification Search ................ None
See application file for complete search history.

(56) References Cited

U.S. PATENT DOCUMENTS

| | | | | |
|---|---|---|---|---|
| 5,463,581 A | * | 10/1995 | Koshikawa | 365/189.18 |
| 5,487,043 A | * | 1/1996 | Furutani et al. | 365/203 |
| 6,088,291 A | * | 7/2000 | Fujioka et al. | 365/233.14 |
| 6,269,046 B1 | * | 7/2001 | Lee et al. | 365/230.06 |
| 6,385,104 B2 | * | 5/2002 | Koshikawa | 365/201 |
| 6,535,438 B2 | * | 3/2003 | Ariki | 365/200 |
| 2007/0104013 A1 | | 5/2007 | Lee | |
| 2008/0151589 A1 | | 6/2008 | Koshita | |

FOREIGN PATENT DOCUMENTS

| | | |
|---|---|---|
| JP | 2007-134034 | 5/2007 |
| JP | 2008-159171 | 7/2008 |
| KR | 1019990015874 | 3/1999 |
| KR | 10-0295632 | 5/2001 |
| KR | 1020030057949 | 7/2003 |
| KR | 10-0656432 | 12/2006 |
| KR | 10-0755370 | 8/2007 |

OTHER PUBLICATIONS

English Abstract for Publication No. 10-1999-0015874.
English Abstract for Publication No. 10-0295632.
English Abstract for Publication No. 10-2003-0057949.
English Abstract for Publication No. 10-0656432.
English Abstract for Publication No. 2007-134034.
English Abstract for Publication No. 10-0755370.
English Abstract for Publication No. 2008-159171.

* cited by examiner

*Primary Examiner* — Tan T. Nguyen
(74) *Attorney, Agent, or Firm* — F. Chau & Associates, LLC

(57) ABSTRACT

A semiconductor memory device is provided. A memory cell array has a plurality of memory cells connected between a plurality of word lines and a plurality of bit-line pairs. A sense amplifier unit has a plurality of sense amplifiers connected with the bit-line pairs respectively and amplifies data of the bit-line pairs to a sensing voltage level. A command decoder decodes a command applied from the outside and outputs the decoded command. A plurality of input/output (I/O) gates electrically connects the bit-line pairs with corresponding I/O line pairs in response to a voltage level applied through a plurality of corresponding column selection lines. A column decoder decodes a column address and drives at least one of the column selection lines to a plurality of different voltages levels.

20 Claims, 15 Drawing Sheets

SEMICONDUCTOR MEMORY DEVICE

CROSS-REFERENCE TO RELATED APPLICATIONS

This application claims under 35 U.S.C. §119 priority to and the benefit of Korean Patent Application No. 10-2009-0002680, filed on Jan. 13, 2009, and Korean Patent Application No. 10-2009-0051996, filed on Jun. 11, 2009, the entire content of both of which are incorporated by reference herein.

BACKGROUND

1. Technical Field

The present disclosure relates to semiconductor memory devices, and more particularly, to a semiconductor memory device that can adjust the voltage level of a column selection line.

2. Discussion of Related Art

A semiconductor memory device has memory cells connected between word lines and bit lines. When a semiconductor memory device receives addresses from the outside during a read operation, a row decoder decodes a row address among the addresses and activates the corresponding word line. Memory cells connected with the activated word line apply stored data to bit-line pairs, and sense amplifiers sense and amplify the data applied through the corresponding bit-line pairs. A column decoder activated in response to a column enable signal decodes a column address among the addresses and activates a predetermined number of column selection lines to a predetermined voltage level. The activated column selection lines activate input/output (I/O) gates for connecting bit-line pairs with the corresponding I/O line pairs. When the bit-line pairs are connected with the I/O line pairs by the activated I/O gates, the amplified data on the bit-line pairs is output to the outside through the I/O lines.

A point in time at which the column enable signal is activated is determined by row address strobe (RAS) to column address strobe (CAS) delay time (tRCD) that indicates a delay until a read command or write command is input after an active command is input. The column enable signal is set to be activated after data of a memory cell is carried on a bit-line pair and a minute voltage difference between the bit-line pair is completely amplified by a sense amplifier. During a read operation of the semiconductor memory device, the column enable signal may be activated with the voltage difference between the bit-line pair not completely amplified, and a column selection line activated by the column decoder may turn on an I/O gate. In this case, the voltage level of the bit-line pair may be distorted by the voltage of an I/O line pair driven to a higher voltage level than the bit-line pair.

On the other hand, when a bit-line pair is connected with an I/O line pair by an activated I/O gate during a write operation of the semiconductor memory device, data of the bit-line pair is converted into data applied through an I/O line pair. Then, data of the bit-line pair is amplified by a sense amplifier and stored in a memory cell connected with an activated word line.

Currently, a column selection line is generally driven for activation to an external power supply voltage level which is higher than an internal supply voltage level regardless of a read or write operation of a semiconductor memory device in order to rapidly convert data of a bit-line pair into data of an I/O line pair during the write operation. When a semiconductor memory device drives a column selection line to an external power supply voltage level, a sudden change in the voltage level of a bit-line pair may be caused by a voltage precharged to an I/O line pair during a read operation, and the read operation may be slowed down. Otherwise, the voltage levels of a bit line and an inverted bit line may be reversely sensed and amplified, and data of the bit-line pair may be switched.

SUMMARY

Exemplary embodiments of the inventive concept provide a semiconductor memory device that can adjust the voltage level of a column selection line to stably increase an operating speed.

According to an exemplary embodiment a semiconductor memory device includes a memory cell array having a plurality of memory cells connected between respective word lines and bit-line pairs. A sense amplifier unit has a plurality of sense amplifiers connected with the bit-line pairs respectively and is configured to amplify data of the bit-line pairs to a sensing voltage level. A command decoder is configured to decode a command applied from the outside and to output a decoded command. A plurality of input/output (I/O) gates is configured to electrically connect the bit-line pairs with corresponding I/O line pairs in response to a voltage level applied through corresponding column selection lines. A column decoder is configured to decode a column address in response to the decoded command and to drive at least one of the column selection lines to a plurality of different voltages levels.

The column decoder may include a decoder configured to selectively activate at least one of a plurality of read column selection signals or one of a plurality of write column selection signals in response to the column address and a write enable signal applied from the command decoder, and a driver unit having a plurality of column selection line drivers each configured to drive a corresponding one of the column selection lines to a level of a read power supply voltage or a level of a write power supply voltage in response to a corresponding one of the read column selection signals, a corresponding one of the write column selection signals, and a column enable signal.

Each of the column selection line drivers may include a column selection line enable signal generator configured to output a read column enable signal, a write column enable signal, and a column selection line enable signal in response to the corresponding read column selection signal, the corresponding write column selection signal, and the column enable signal, and a column selection line driving unit configured to drive the corresponding column selection line to the level of the read power supply voltage or to the level of the write power supply voltage in response to the read column enable signal, the write column enable signal, and the column selection line enable signal.

The column selection line enable signal generator may include a first inverter configured to invert the corresponding read column selection signal, a second inverter configured to invert the corresponding write column selection signal, a first NAND gate configured to perform a NAND operation on an output signal of the first inverter and the column enable signal and to output the read column enable signal, a second NAND gate configured to perform a NAND operation on an output signal of the second inverter and the column enable signal and to output the write column enable signal, and an AND gate configured to perform an AND operation on the read column enable signal and the write column enable signal and to output the column selection line enable signal.

The column selection line driving unit may include a read driver configured to receive the read power supply voltage in response to the read column enable signal and to drive the corresponding column selection line to the level of the read power supply voltage, a write driver configured to receive the write power supply voltage in response to the write column enable signal and to drive the corresponding column selection line to the level of the write power supply voltage, and a deactivator configured to drive the corresponding column selection line to a ground voltage level in response to the column selection line enable signal.

The read driver may have a first p-type metal oxide semiconductor (PMOS) transistor connected between the read power supply voltage and the corresponding column selection line and is configured to receive the corresponding read column selection signal through a gate. The write driver may have a second PMOS transistor connected between the write power supply voltage and the corresponding column selection line and is configured to receive the corresponding write column selection signal through a gate.

The second PMOS transistor may have a first gate and a second gate extending in a direction of the bit-line pairs and disposed in parallel in a direction of the word lines, and a third gate configured to connect one end of the first gate with one end of the second gate on a substrate. The first PMOS transistor may have a fourth gate and a fifth gate extending in the direction of the bit-line pairs and disposed in parallel in the direction of the word lines, and a sixth gate configured to connect one end of the fourth gate with one end of the fifth gate on the substrate.

The first PMOS transistor and the second PMOS transistor may include a source of the first PMOS transistor formed between the fourth gate and the fifth gate in the substrate, and configured to receive the read power supply voltage, a first drain and a second drain of the first PMOS transistor and the second PMOS transistors respectively foamed between the first gate and the fourth gate and between the second gate and the fifth gate in the substrate and connected with the corresponding column selection line, and a first source and a second source of the second PMOS transistor respectively formed on opposite sides of the first drain and the second drain with respect to the first gate and the second gate in the substrate, and configured to receive the write power supply voltage.

The read power supply voltage may be an internal power supply voltage, and the write power supply voltage may be an external power supply voltage having a higher level than the internal power supply voltage.

The read driver may include a first control p-type metal oxide semiconductor (PMOS) transistor connected between an internal power supply voltage and a first node, and configured to receive a first control signal through a gate, a second control PMOS transistor connected between an external power supply voltage and the first node, and configured to receive a second control signal through a gate, and a first PMOS transistor connected between the first node and the corresponding column selection line, and configured to receive the corresponding read column selection signal through a gate.

The write driver may include a third control PMOS transistor connected between the external power supply voltage and a second node, and configured to receive a third control signal through a gate, a fourth control PMOS transistor connected between the internal power supply voltage and the second node, and configured to receive a fourth control signal through a gate, and a second PMOS transistor connected between the second node and the corresponding column selection line, and configured to receive the corresponding write column selection signal through a gate.

The first control signal, the second control signal, the third control signal and the fourth control signal may be designated by setting a mode register set signal from outside of the semiconductor memory device.

The column decoder may include a decoder configured to selectively activate at least one of a plurality of column selection line enable signals in response to the column address, a voltage selector configured to select and to output a read power supply voltage or a write power supply voltage in response to a write enable signal applied from the command decoder, and a driver unit having a plurality of column selection line drivers each configured to drive a corresponding one of the column selection lines to a level of the read power supply voltage or the write power supply voltage in response to a corresponding one of the column selection line enable signals.

The semiconductor memory device may further include a delayer configured to receive an active signal from the command decoder, to delay the active signal, and to output a level changing signal.

The column decoder may include a decoder configured to decode the column address and to selectively activate at least one of a plurality of coding signals, a voltage selector configured to generate the supply voltage having the level of the first reference voltage when the level changing signal is deactivated and the supply voltage having the level of the second reference voltage when the level changing signal is activated, and a driver unit configured to activate a column selection signal to the level of the supply voltage in an active signal portion of a column enable signal in response to the activated coding signal.

The voltage selector may includes a switch configured to output the first reference voltage when the level changing signal is deactivated and the second reference voltage when the level changing signal is activated, and a differential amplifier configured to generate the supply voltage set to the level of the first reference voltage or the second reference voltage selectively output from the switch.

The column decoder may include a decoder configured to selectively activate at least one of a plurality of column selection line enable signals in response to the column address, a supply voltage generator configured to generate a first supply voltage having a level of a first reference voltage and a second supply voltage having a level of a second reference voltage, a switching signal generator configured to activate a first switching signal when a column selection line enable signal is in an active state and the level changing signal is in an inactive state, and a second switching signal when the column selection line enable signal is in the active state and the level changing signal is in the active state, and a driver unit having a plurality of column selection line drivers each configured to drive a corresponding one of the column selection lines to the level of the first reference voltage in an active signal portion of the first switching signal and to the level of the second supply voltage in an active signal portion of the second switching signal.

The supply voltage generator may include a first supply voltage generator configured to receive the first reference voltage and to generate a first supply voltage set to the level of the first reference voltage, and a second supply voltage generator configured to receive the second reference voltage and to generate a second supply voltage set to the level of the second reference voltage.

According to an exemplary embodiment a semiconductor memory device includes
a memory cell array having a plurality of memory cells connected between respective word lines and bit-line pairs, a sense amplifier unit having a plurality of sense amplifiers connected with the bit-line pairs respectively and configured to amplify data of the bit-line pairs to a sensing voltage level, a command decoder configured to decode a command applied from the outside and to output a decoded command, a plurality of input/output (I/O) gates configured to electrically connect the bit-line pairs with corresponding I/O line pairs in response to a voltage level applied through corresponding column selection lines, and a column decoder configured to decode a column address in response to the decoded command and to drive at least one of the column selection lines to a plurality of different voltages levels. The column decoder includes a decoder configured to selectively activate at least one of a plurality of column selection line enable signals in response to the column address, a voltage selector configured to output a supply voltage whose level varies in response to a level changing signal, and a driver unit having a plurality of column selection line drivers each configured to drive a corresponding one of the column selection lines to the supply voltage applied from the voltage selector in response to a corresponding one of the column selection line enable signals.

The voltage selector may receive a first reference voltage and a second reference voltage, and may output the supply voltage with a level of the first reference voltage in a first signal portion in which the level changing signal is in an inactive state and with a level of the second reference voltage in a second signal portion in which the level changing signal is in an active state.

The semiconductor memory device may further include a delayer configured to receive an active signal from the command decoder, to delay the active signal, and to output the level changing signal.

DETAILED DESCRIPTION OF THE EMBODIMENTS

Figure 1:
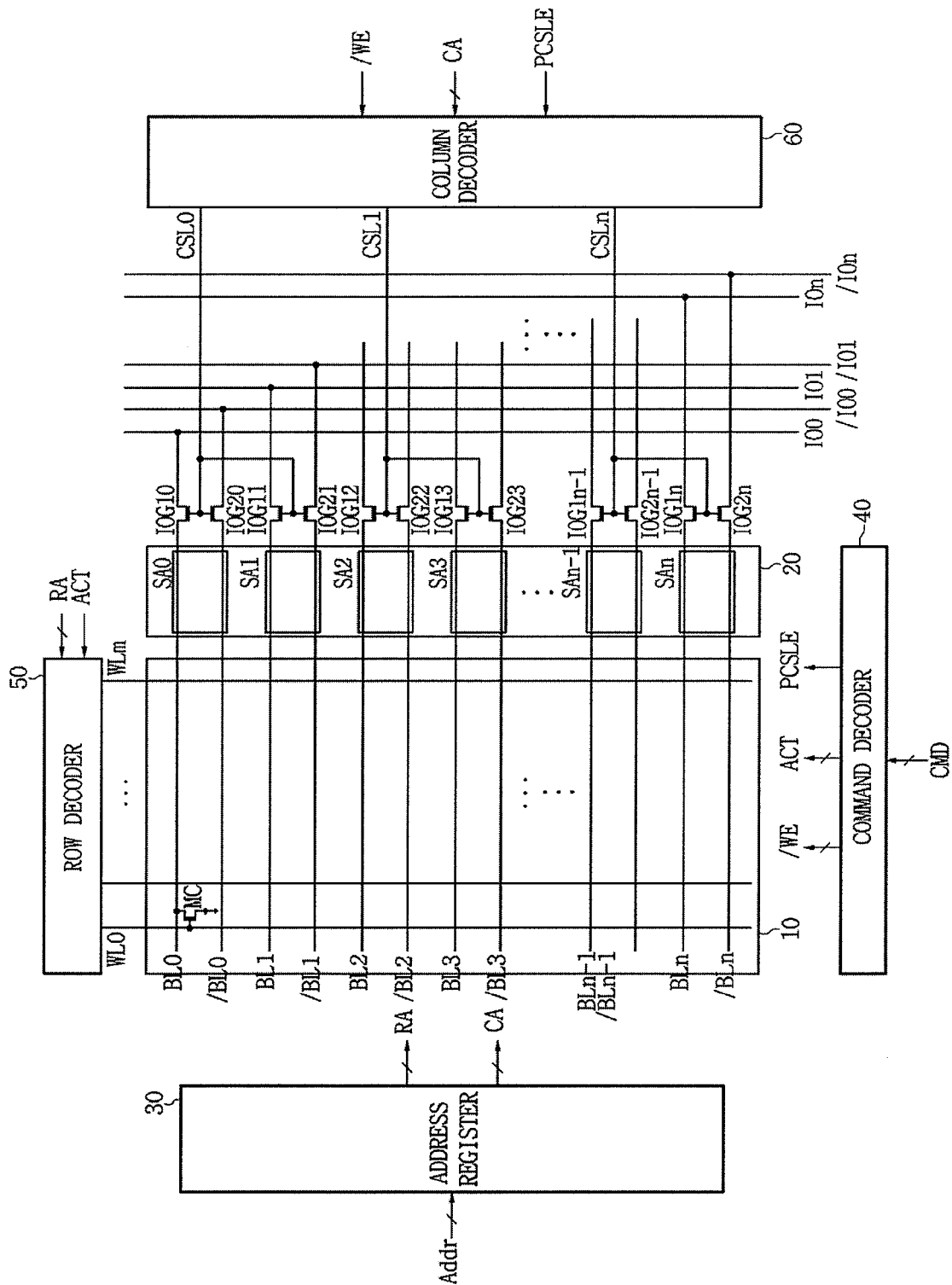
FIG. 1 is a block diagram of a semiconductor memory device according to an exemplary embodiment.

Various exemplary embodiments will now be described more fully with reference to the accompanying drawings. In the drawings, the thicknesses of layers and regions may be exaggerated for clarity. Like numbers refer to like elements throughout the description of the figures.

While detailed illustrative embodiments are disclosed herein, specific structural and functional details are merely representative for purposes of describing the exemplary embodiments. The present inventive concept, however, may be embodied in many alternate forms and should not be construed as being limited to only the exemplary embodiments set forth herein.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Exemplary embodiments may be described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

A semiconductor memory device that can adjust the voltage level of a column selection line will now be described with reference to the accompanying drawings.

FIG. 1 is a block diagram of a semiconductor memory device according to an exemplary embodiment.

The semiconductor memory device includes a memory cell array 10, a sense amplifier unit 20, an address register 30, a command decoder 40, a row decoder 50, and a column decoder 60. The memory cell array 10 has a plurality of memory cells MC connected among a plurality of word lines WL0, WL1, WLm and a plurality of bit-line pairs BL0 BL0, BL1/BL1, BLn/BLn. The sense amplifier unit 20 has a plurality of sense amplifiers SA0, SA1, SAn corresponding to the bit-line pairs BL0/BL0, BL1/BL1, . . . BLn/BLn respectively, and senses and amplifies data applied through the bit-line pairs. A plurality of input/output (I/O) gates IOG10, IOG20, IOG11, IOG21, . . . IOG1n, IOG2n are activated according to voltage levels applied to the corresponding column selection lines CSL0, CSL1, . . . CSLn, and connect the bit-line pairs BL0/BL0, BL1/BL1, . . . BLn/BLn with corresponding I/O lines IO0/IO0, IO1/IO1, . . . IOn/IOn respectively.

The address register 30 receives an address Addr from the outside, classifies the received address Addr into a row address RA and a column address CA, and outputs the row address RA and the column address CA to the row decoder 50 and the column decoder 60, respectively. The command decoder 40 receives a command CMD from the outside, decodes the command CMD, and outputs an active signal ACT, a column enable signal PCSLE and a write enable signal/WE. The row decoder 50 is activated in response to the active signal ACT, decodes the row address RA applied from the address register 30, and activates the corresponding word line among the word lines WL0, WL1, . . . WLm. The column decoder 60 is activated in response to the column enable signal PCSLE, decodes the column address CA, and selects a predetermined number of column selection lines among the column selection lines CSL0, CSL1, . . . CSLn. The column decoder 60 has a plurality of column selection line drivers (not shown), and drives the selected column selection lines to a predetermined voltage level in response to the write enable signal/WE applied from the command decoder 40.

Figure 2:
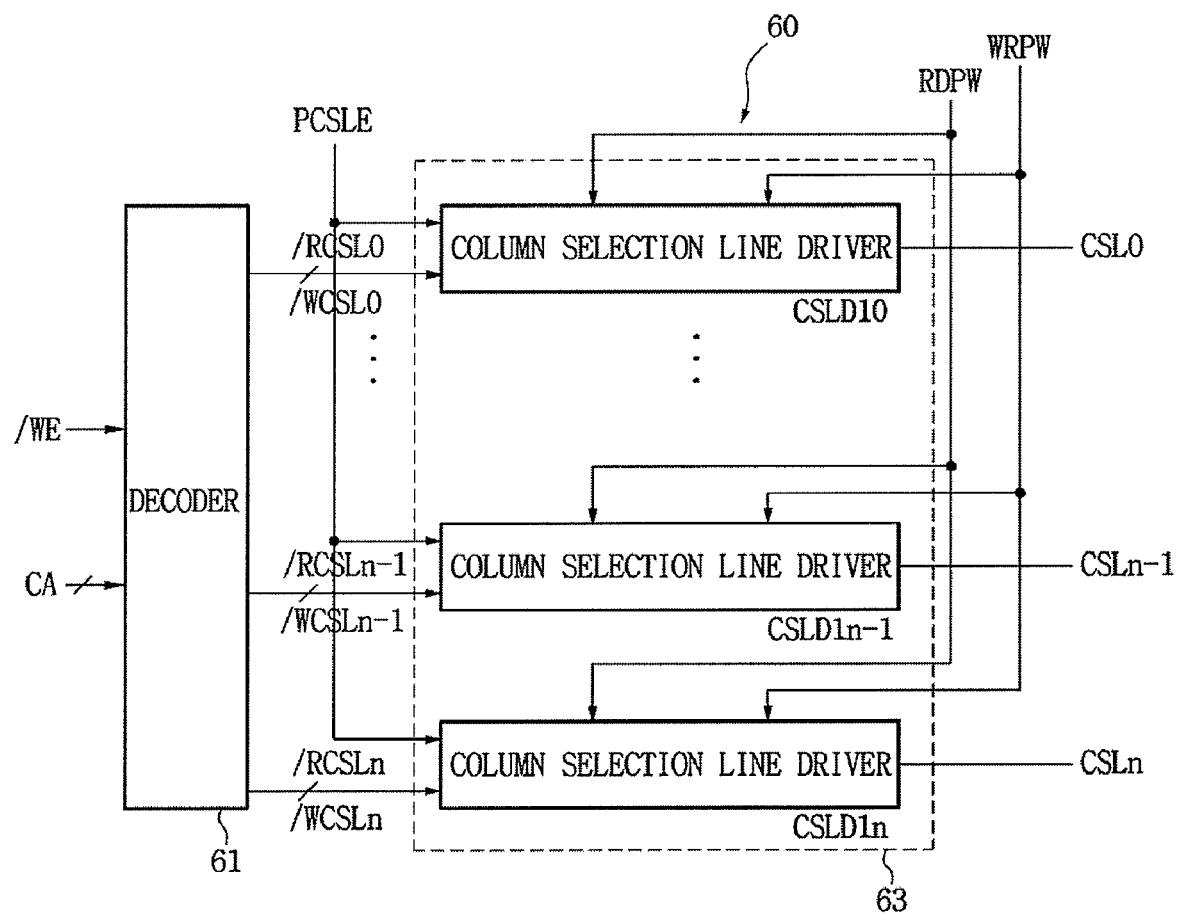
FIG. 2 is a block diagram of an exemplary embodiment of a column decoder of FIG. 1.

FIG. 2 is a block diagram of an exemplary embodiment of the column decoder 60 of FIG. 1.

The column decoder 60 includes a decoder 61 and a driver unit 63. The decoder 61 receives the column address CA in response to the write enable signal/WE, decodes the received column address CA, and selects and activates at least one of a plurality of read column selection signals/RCSL0, . . . /RCSLn−1, /RCSLn and a plurality of write column selection signals /WCSL0, . . . /WCSLn−1, /WCSLn. When the column address CA applied from the address register 30 indicates a column selection line CSLi corresponding to a column selection line driver and the write enable signal/WE indicates a read command, one read column selection signal/RCSLi among the read column selection signals/RCSL0, . . . /RCSLn−1, /RCSLn is activated to a low level. When the column address CA indicates a column selection line CSLi corresponding to a column selection line driver and the write enable signal/WE indicates a write command, one write column selection signal/WCSLi among the write column selection signals/WCSL0, . . . /WCSLn−1, /WCSLn is activated to a low level.

The driver unit 63 has a plurality of column selection line drivers CSLD10, . . . CSLD1n-1, CSLD1n. The respective column selection line drivers CSLD10, . . . CSLD1n-1, CSLD1n receive the corresponding read column selection signals/RCSL0 to /RCSLn, the corresponding write column selection signals/WCSL0, . . . /WCSLn−1, /WCSLn, and the column enable signal PCSLE, and drive the corresponding column selection lines CSL0, CSL1, . . . CSLn to different voltages during a read operation and a write operation in the active signal portion of the column enable signal PCSLE.

Figure 3:
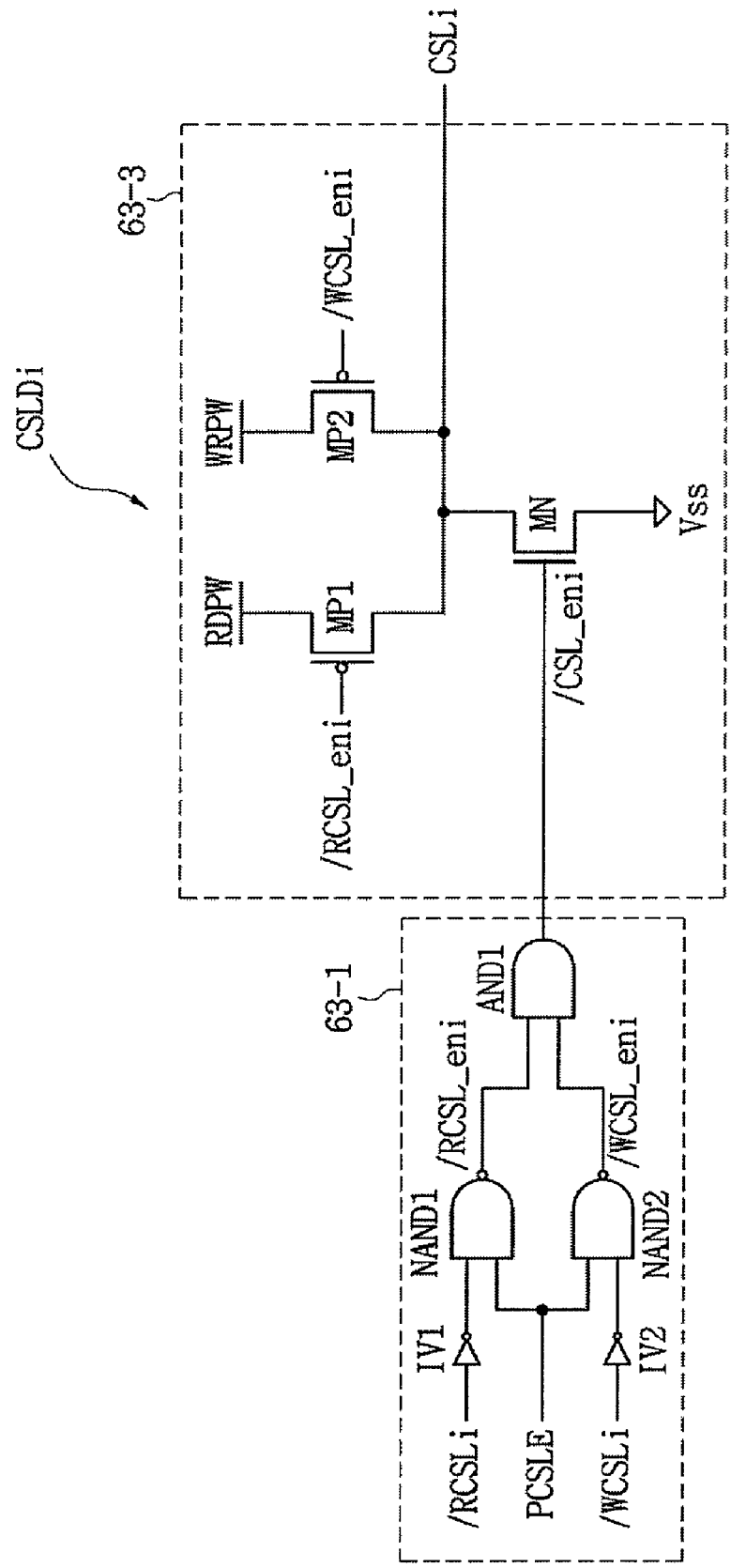
FIG. 3 is a circuit diagram of an exemplary embodiment of a column selection line driver of FIG. 2.

FIG. 3 is a circuit diagram of an exemplary embodiment of a column selection line driver of FIG. 2.

As described above, the column decoder 60 has the column selection line drivers CSLD10, . . . CSLD1n-1, CSLD1n. Each of the column selection line drivers CSLD10, . . . CSLD1n-1, CSLD1n has a column selection line enable signal generator 63-1 and a column selection line driving unit 63-3. The column selection line enable signal generator 63-1 has an inverter IV1 that inverts the corresponding read column selection signal/RCSLi, an inverter IV2 that inverts the corresponding write column selection signal/WCSLi, a NAND gate NAND1 that performs a NAND (non-conjunction) operation on an output signal of the inverter IV1 and the column enable signal PCSLE and outputs a read column enable signal/RCSL_eni, a NAND gate NAND2 that performs a NAND operation on an output signal of the inverter IV2 and the column enable signal PCSLE and outputs a write column enable signal/WCSL_eni, and an AND gate AND1 that performs an AND (conjunction) operation on the read column enable signal/RCSL_eni and the write column enable signal/WCSL_eni and outputs a column selection line enable signal/CSL_eni.

The read column enable signal/RCSL_eni is activated to a low level when the read column selection signal/RCSLi is activated to a low level and the column enable signal PCSLE is activated to a high level. The write column enable signal/WCSL_eni is activated to a low level when the write column selection signal/WCSLi is activated to a low level and the column enable signal PCSLE is activated to a high level. The column selection line enable signal/CSL_eni is deactivated to a high level when both the read column enable signal/RCSLi_eni and the write column enable signal/WCSLi_eni are deactivated to a high level.

The column selection line driving unit 63-3 has a first p-type metal oxide semiconductor (PMOS) transistor MP1 that is connected between a read power supply voltage RDPW and the corresponding column selection line CSLi and receives the read column enable signal/RCSL_eni through a gate, a second PMOS transistor MP2 that is connected between a write power supply voltage WRPW and the corresponding column selection line CSLi and receives the write column enable signal/WCSL_eni through a gate, and an n-type metal oxide semiconductor (NMOS) transistor MN that is connected between the corresponding column selection line CSLi and a ground voltage Vss and receives the column selection line enable signal/CSL_eni through a gate. The first PMOS transistor MP1 drives the column selection line CSLi to the level of the read power supply voltage RDPW when the read column enable signal/RCSL_eni is activated to a low level. The second PMOS transistor MP2 drives the column selection line CSLi to the level of the write power supply voltage WRPW when the write column enable signal/WCSL_eni is activated to a low level.

Here, the read power supply voltage RDPW and the write power supply voltage WRPW have different levels. For example, an internal power supply voltage IVC may be used as the read power supply voltage RDPW, and an external power supply voltage EVC may be used as the write power supply voltage WRPW.

In the above description, a column selection line driver CSLDi has the column selection line enable signal generator 63-1, receives the column enable signal PCSLE, the read column selection signal/RCSLi, and the write column selection signal/WCSLi, and generates the read column enable signal/RCSL_eni, the write column enable signal /WCSL_eni and the column selection line enable signal/CSL_eni. However, the column selection line enable signal generator 63-1 may be included in the decoder 61.

The operation of the semiconductor memory device of FIG. 1 will now be described with reference to FIGS. 1 to 3. When the address Addr and the command CMD are applied from the outside, the address register 30 receives and classifies the address Addr into the row address RA and the column address CA and outputs the row address RA and the column address CA to the row decoder 50 and the column decoder 60, respectively. The row decoder 50 decodes the row address RA and activates the corresponding word line among the word lines WL0, . . . WLm. The respective memory cells MC connected to the activated word line apply stored data to the corresponding bit-line pairs, and the respective sense amplifiers SA0, SA1, . . . SAn of the sense amplifier unit 20 sense and amplify the data applied through the corresponding bit-line pairs.

Meanwhile, the decoder 61 of the column decoder 60 decodes the column address CA and selects one column selection line driver CSLDi among the column selection line drivers CSLD10, . . . CSLD1n-1, CSLD1n. And, when the write enable signal/WE applied from the command decoder 40 indicates a read command, the decoder 61 activates and applies the read column selection signal/RCSLi to the selected column selection line driver CSLDi. On the other hand, when the write enable signal/WE applied from the command decoder 40 indicates a write command, the decoder 61 activates and applies the write column selection signal/WCSLi to the selected column selection line driver CSLDi.

In response to the column enable signal PCSLE, the corresponding read column selection signal/RCSLi and the corresponding write column selection signal /WCSLi, the selected column selection line driver CSLDi activates the column selection line enable signal/CSL_eni and drives the corresponding column selection line CSLi to the level of the read power supply voltage RDPW or the write power supply voltage WRPW.

When the read column selection signal/RCSLi is activated to a low level and the column enable signal PCSLE is activated to a high level, the read column enable signal/RCSL_eni is activated. Then, the first PMOS transistor MP1 is turned on, and the second PMOS transistor MP2 and the NMOS transistor MN are turned off. Thus, the column selection line CSLi is driven to the level of the read power supply voltage RDPW. On the other hand, when the write column selection signal/WCSLi is activated to a low level and the column enable signal PCSLE is activated to a high level, the write column enable signal/WCSL_eni is activated. Then, the second PMOS transistor MP2 is turned on, and the first PMOS transistor MP1 and the NMOS transistor MN are turned off. Thus, the column selection line CSLi is driven to the level of the write power supply voltage WRPW. However, when both the read column selection signal/RCSLi and the write column selection signal/WCSLi are deactivated or the column enable signal PCSLE is deactivated, both the read column enable signal/RCSL_eni and the write column enable signal/WCSL_eni are deactivated, and the column selection line enable signal/CSL_eni is activated to a high level. Thus, the NMOS transistor MN is turned on, the first and second PMOS transistors MP1, MP2 are turned off, and the column selection line CSLi is driven to the level of the ground voltage Vss. In other words, the corresponding column selection line CSLi is deactivated. As a result, a column selection line driver of FIG. 2 is selected by the column address CA and drives the corresponding column selection line CSLi to different voltage levels according to whether the write enable signal/WE indicates a read command or a write command.

The column selection lines CSL0, CSL1, . . . CSLn that are driven by the column selection line drivers to different voltages during the read and write operations activate the corresponding I/O gates IOG10, IOG20, IOG11, IOG21, . . . IOG1n, IOG2n and connect the corresponding bit-line pairs BL0/BL0 with the corresponding I/O line pairs IO0/IO0, IO1/IO1, . . . IOn/IOn. Although one column selection line CSLi is configured to connect only one bit-line pair BLi/BLi with only one I/O line pair IOi/IOi in the semiconductor memory device of FIG. 1, one column selection line CSLi may be configured to connect a plurality of the bit-line pairs BL0/BL0, BL1/BL1, . . . BLn/BLn with a plurality of the I/O line pairs IO0/IO0, IO1/IO1, . . . IOn/IOn so that the semiconductor memory device can have a high speed and high capacity. For example, each column selection line may connect two of the bit-line pairs BL0/BL0, BL1/BL1, . . . BLn/BLn with two of the I/O line pairs IO0/IO0, IO1/IO1, . . . IOn / IOn. When one column selection line is configured to connect a plurality of the bit-line pairs BL0/BL0, BL1/BL1, . . . BLn/BLn with a plurality of the I/O line pairs IO0/IO0, IO1/IO1, . . . IOn/IOn, the number of column selection line drivers can be remarkably reduced.

When the read power supply voltage RDWP is the internal power supply voltage IVC, a voltage having a lower level than the external power supply voltage EVC is applied to the gates of the I/O gates IOG10, IOG20, IOG11, IOG21, . . . IOG1n, IOG2n. Thus, a sudden change in the voltage level of the bit-line pairs BL0/BL0, BL1/BL1, . . . BLn/BLn due to a voltage precharged to the I/O line pairs IO0/IO0, IO1/IO1, . . . IOn/IOn does not occur during the read operation, and the operating speed increases. As a result, amplified data on the bit-line pairs BL0/BL0, BL1/BL1, . . . BLn/BLn is rapidly output to the outside through the I/O line pairs IO0/IO0, IO1/IO1, . . . IOn/IOn.

When the write power supply voltage WRWP has the level of the external power supply voltage EVC, a voltage having a higher level than the internal power supply voltage IVC is applied to the gates of the I/O gates IOG10, IOG20, IOG11, IOG21, . . . IOG1n, IOG2n. Thus, data of the bit-line pairs BL0/BL0, BL1/BL1, . . . BLn/BLn may be converted into data applied through the I/O line pairs IO0/IO0, IO1/IO1, . . . IOn/IOn. The converted data of the bit-line pairs BL0 /BL0, BL1/BL1, . . . BLn/BLn is stored in the corresponding memory cells MC.

In other words, a column selection line CSLi is driven to different voltage levels according to the read and write operations so that the read and write operational speeds of the semiconductor memory device can be improved.

According to a characteristic or use of the semiconductor memory device, the external power supply voltage EVC may be used as the read power supply voltage RDPW, and the internal power supply voltage IVC may be used as the write power supply voltage WRPW.

Figure 4:
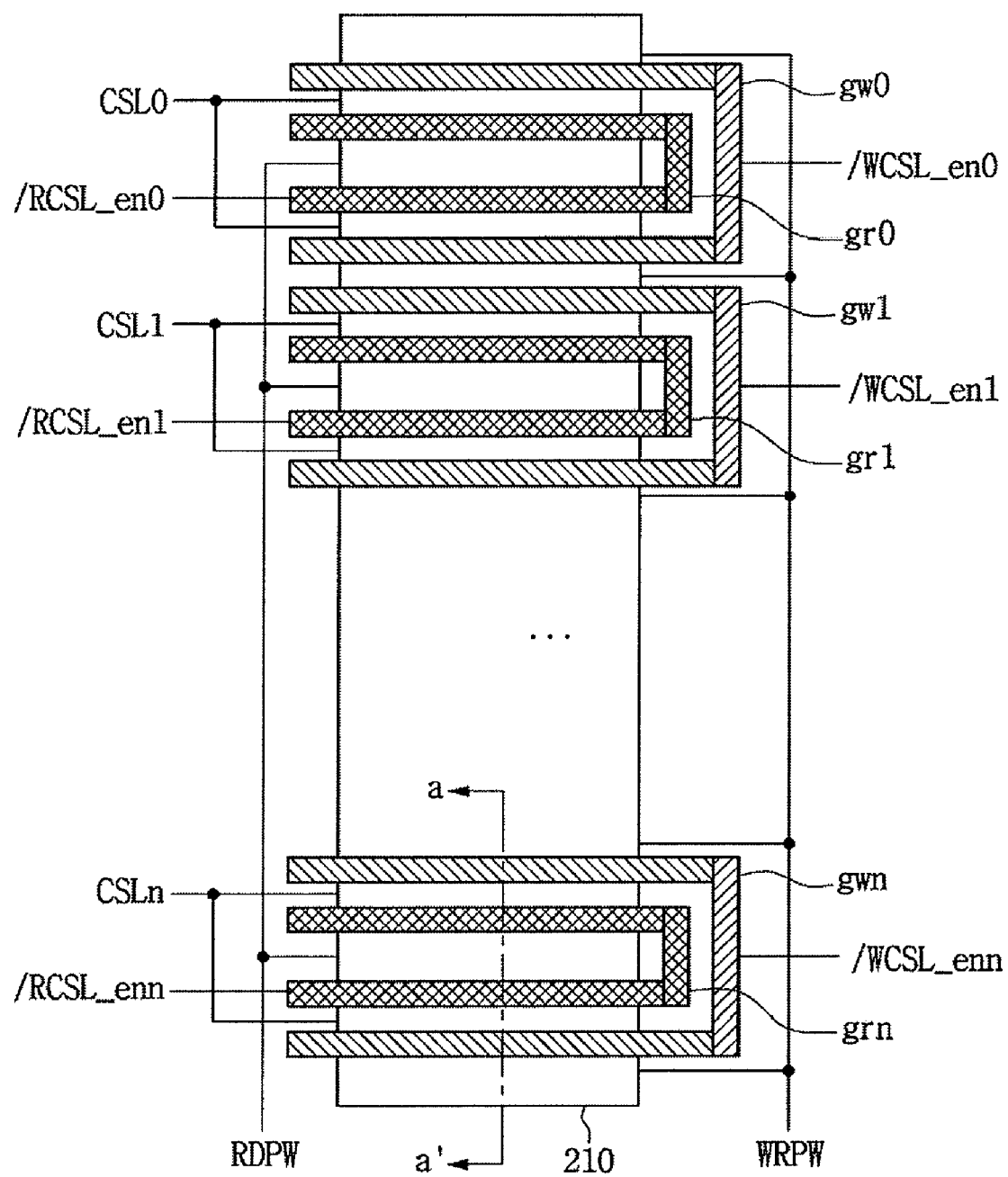
FIGS. 4 and 5 illustrate an exemplary embodiment of p-type metal oxide semiconductor (PMOS) transistors in the column selection line driver of FIG. 3.
Figure 5:
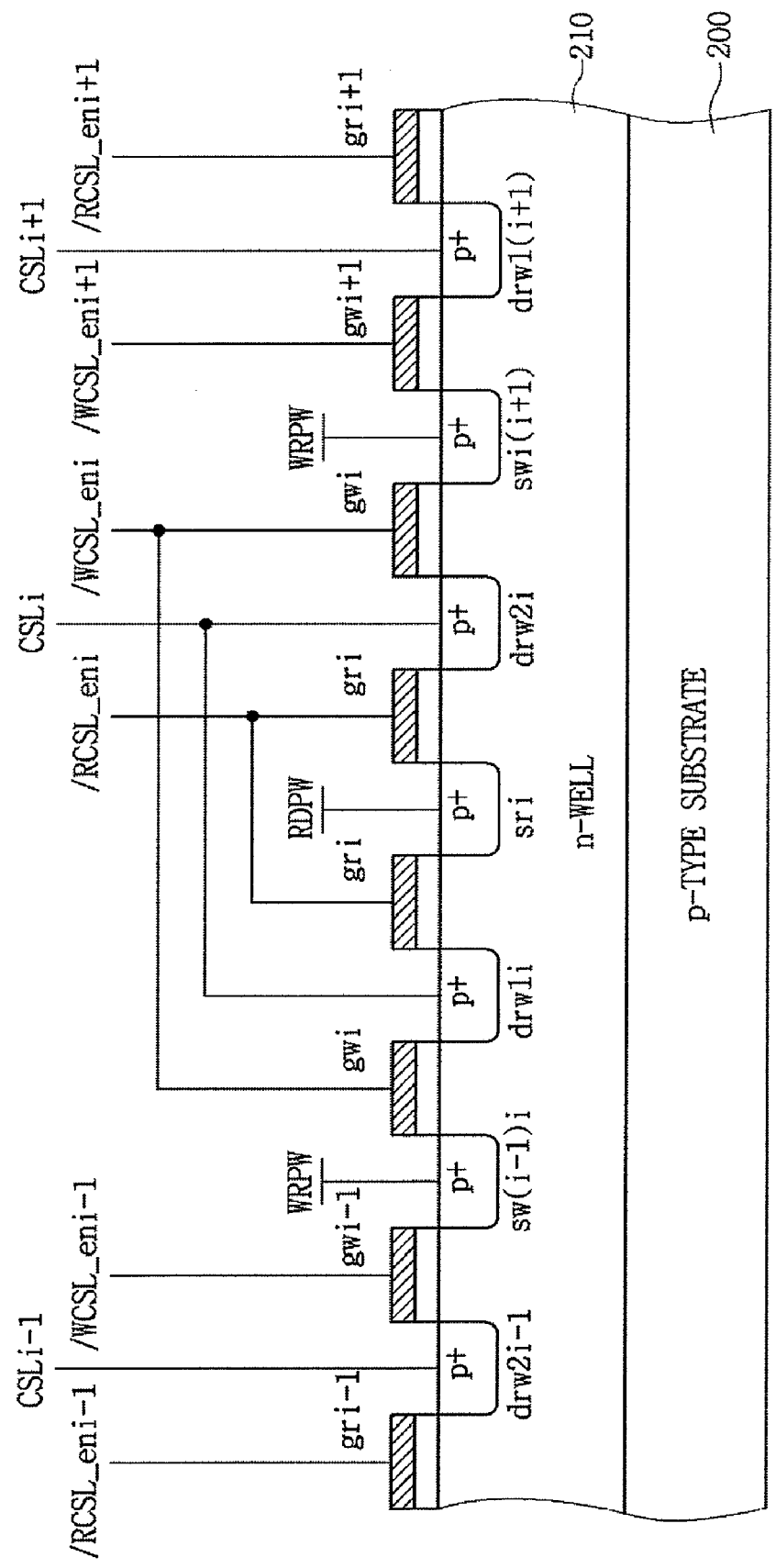

FIGS. 4 and 5 illustrate an exemplary embodiment of PMOS transistors in the column selection line driver of FIG. 3. FIG. 5 is a cross-sectional view (taken along line a-a') of PMOS transistors of the column selection line driver of FIG. 4.

The column selection line driver of FIG. 3 has one more PMOS transistor as compared with a conventional column selection line driver, and thus the layout area of the semiconductor memory chip increases. However, when one column selection line CSLi connects two of the bit-line pairs BL0/BL0, BL1/BL1, . . . BLn/BLn with two of the I/O line pairs IO0/IO0, IO1/IO1, . . . IOn/IOn as mentioned above, to prevent the increase in the layout area of the semiconductor memory chip, the number of column selection line drivers required by the column decoder 60 is reduced by half, and the layout area of the semiconductor memory chip does not increase. Also, even if PMOS transistors are added to respective column selection line drivers, the number of the NMOS transistors MN is reduced by half, and it is actually possible to reduce the layout area required for the column decoder 60 to have a plurality of column selection line drivers CSLD0, . . . CSLj (where j is a natural number equal to n/2). Furthermore, when one column selection line CSLi is configured to connect four of the bit-line pairs BL0/BL0, BL1/BL1, . . . BLn/BLn with four of the I/O line pairs IO0/IO0, IO1/IO1, . . . IOn/IOn, the number of column selection line drivers may be reduced to a quarter, so that the layout area of the semiconductor memory chip can be remarkably reduced.

An exemplary embodiment of the column selection line driver of FIG. 3 will now be described with reference to FIGS. 4 and 5. First, an n-well 210 is formed on a p-type substrate 200. A p-type read source region sri that receives the read power supply voltage RDPW is formed in a predetermined region of the n-well 210, and first and second read-write drains drw1i, drw2i that are connected in common with a column selection line CSLi are formed on the both sides of the read source region sri at predetermined intervals in the n-well 210. The read source region sri is the source of the first PMOS transistor MP1. The first and second read-write drains drw1i, drw2i are a common drain of the first and second PMOS transistors MP1, MP2.

On the opposite sides of the read source region sri with respect to the first and second read-write drains drw1i, drw2i, common write source regions sw(i−1)i, swi(i+1) that receive the write power supply voltage WRPW are formed. The common write source regions sw(i−1)i, swi(i+1) are the source of the second PMOS transistor MP2, and are used in common by the second PMOS transistor MP2 of an adjacent column selection line driver.

Read gates gri that receive the read column enable signal/RCSL_eni in common are formed between the read source region sri on the n-well 210 and the respective first and second read-write drains drw1i, drw2i, and write gates gwi are formed between the first read-write drain drw1i and the common write source region sw(i−1)i and between the second read-write drain drw2i and the common write source region swi(i+1). The read gates gri are the gate of the first PMOS transistor MP1, and the write gates gwi are the gate of the second PMOS transistor MP2. Although it is shown in FIG. 5 as if there were two each of the read gates gri and the write gates gwi, the read gates gri are actually formed as one line rather than separate gates as shown in FIG. 4, as are the write gates gwi. In other words, the column selection line drivers of the exemplary embodiments are formed in a shape in which two PMOS transistors are folded in two, as shown in FIG. 4. Thus, it is possible to reduce the width of a column selection line driver by half. Also, since the common write source regions sw(i−1)i, swi(i+1) are used in common by an adjacent column selection line driver and the only one read source region sri is prepared, it is possible to further reduce the layout area of the column selection line driver.

Since the column selection line driver of FIGS. 4 and 5 has the one read source region sri and the two common write source regions sw(i−1)i, swi(i+1), the column selection line driver has a higher driving capability during the write operation than during the read operation. This is because a voltage that drives a column selection line CSLi during the write operation is the external power supply voltage EVC, which has a higher level than the internal power supply voltage IVC during the read operation. However, when a column selection line CSLi is driven to the level of the external power supply voltage EVC during the read operation and to the level of the internal power supply voltage IVC during the write operation as described above, the first PMOS transistor MP1 and the second PMOS transistor MP2 may be formed to have two common read source regions and one write source region so that the column selection line driver has higher driving capability during the read operation than during the write operation unlike FIGS. 4 and 5.

Although it is described above that the n-well 210 is formed on the p-type substrate 200 and the first and second PMOS transistors MP1, MP2 are formed in the n-well 210, the first and second PMOS transistors MP1, MP2 may be formed on an n-type substrate.

Figure 6:
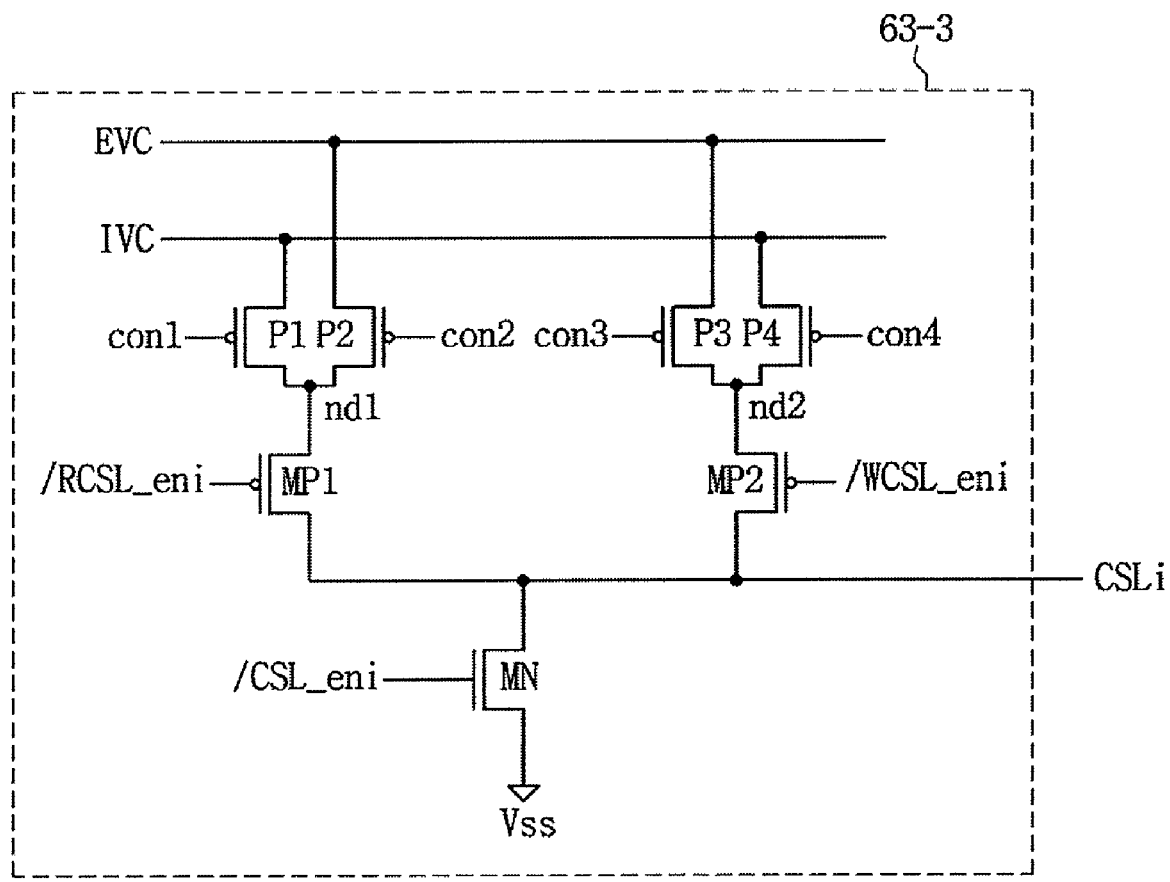
FIG. 6 is a circuit diagram of another exemplary embodiment of a column selection line driver.

FIG. 6 is a circuit diagram of another exemplary embodiment of a column selection line driver. The column selection line driver of FIG. 6 is configured to select the driving voltage level of a column selection line during the read or write operation.

The column selection line driver of FIG. 6 has a similar structure to the column selection line driver of FIG. 2, but additionally has four control PMOS transistors P1, P2, P3, P4 respectively receiving first to fourth control signals con1, con2, con3, con4 between the first PMOS transistor MP1 and the internal and external power supply voltages IVC, EVC and between the second PMOS transistor MP2 and the internal and external power supply voltages IVC, EVC.

The first control PMOS transistor P1 that is connected between the internal power supply voltage IVC and a first node nd1 and receives the first control signal con1 and the second control PMOS transistor P2 that is connected between the external power supply voltage EVC and the first node nd1 and receives the second control signal con2 are connected with the first PMOS transistor MP1 and apply the read power supply voltage RDPW to the first PMOS transistor MP1 in response to the first and second control signals con1, con2.

The third control PMOS transistor P3 that is connected between the external power supply voltage EVC and a second node nd2 and receives the third control signal con3 and the fourth control PMOS transistor P4 that is connected between the internal power supply voltage IVC and the second node nd2 and receives the fourth control signal con4 are connected with the second PMOS transistor MP2 and apply the write power supply voltage WRPW to the second PMOS transistor MP2 in response to the third and fourth control signals con3, con4.

The other elements in FIG. 6 are the same as for the column selection line driver of FIG. 2, and, as such, the description of the other elements is not needed.

In the column selection line driver of FIG. 6, the read power supply voltage RDPW and the write power supply voltage WRPW are selected and used in response to the control signals con1, con2, con3, con4. The control signals con1, con2, con3, con4 may be applied from the command decoder 40 or a controller (not shown) in response to a command applied from the command decoder 40. Also, the control signals con1, con2, con3, con4 may be stored in a mode register (not shown) using a mode register set signal MRS that sets an operation mode of the semiconductor memory device. Since the read power supply voltage RDPW and the write power supply voltage WRPW applied to the column selection line driver are selected in response to the control signals con1, con2, con3, con4, a user may select a voltage for driving a column selection line according to the use of the semiconductor memory device having the column selection line driver of FIG. 6.

For example, when the read and write operations need to be rapidly performed, the first and third control signals con1, con3 are activated to a low level, and the second and fourth control signals con2, con4 are deactivated to a high level, so that the internal power supply voltage IVC is used as the read power supply voltage RDWP and the external power supply voltage EVP is used as the write power supply voltage WRWP. When the power consumption needs to be reduced as much as possible, the first and fourth control signals con1, con4 are activated to a low level, and the second and third control signals con2, con3 are deactivated to a high level, so that the internal power supply voltage IVC is used as both the read power supply voltage RDWP and the write power supply voltage WRWP.

The column selection line driver of FIG. 6 additionally has the four control PMOS transistors P1, P2, P3, P4 as compared with the column selection line driver of FIG. 3, but an increase in the layout area may be minimized in the same manner as described for the layout of FIG. 4.

Figure 7:
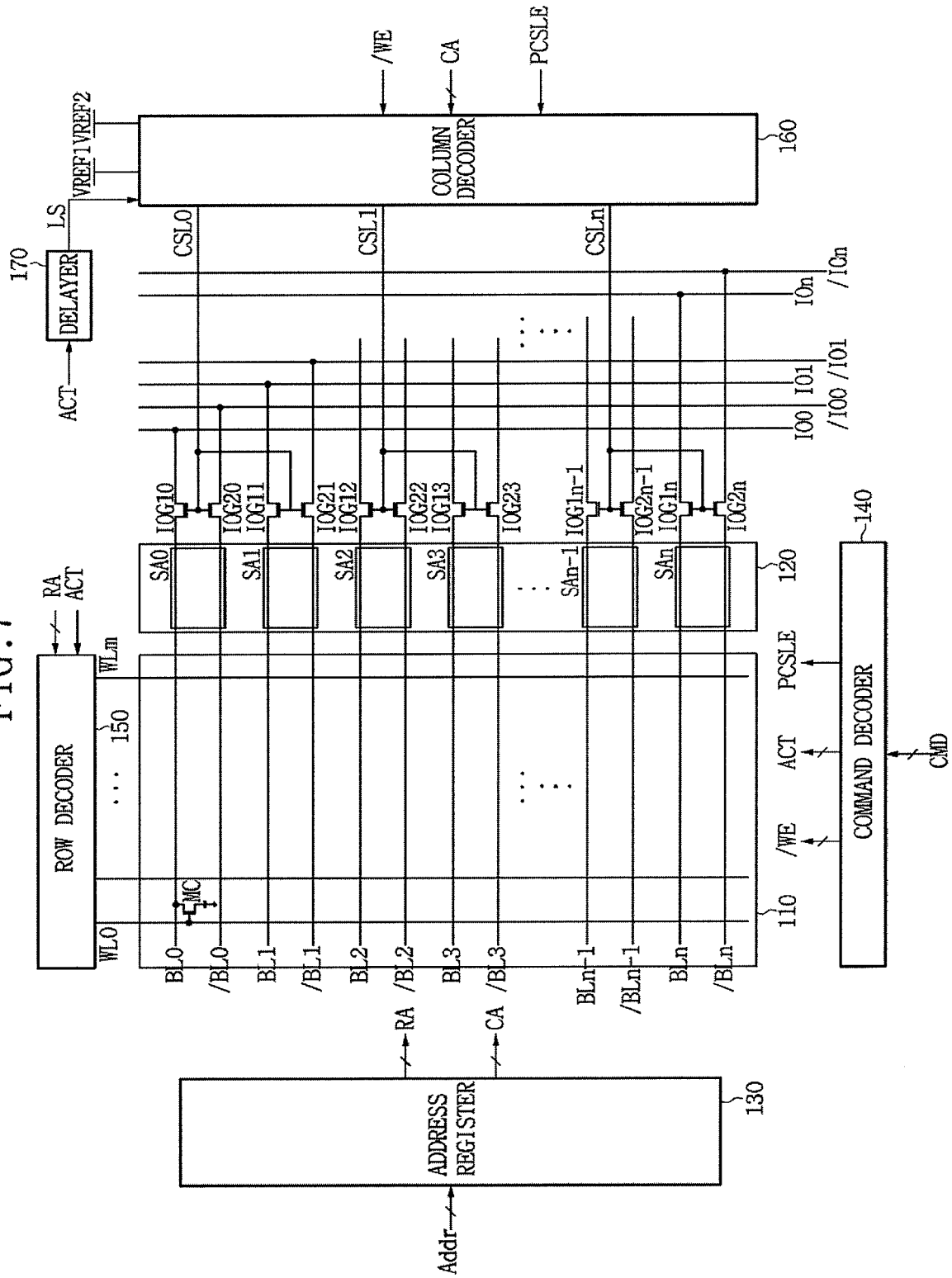
FIG. 7 is a block diagram of a semiconductor memory device according to an exemplary embodiment.

FIG. 7 is a block diagram of a semiconductor memory device according to another exemplary embodiment.

The semiconductor memory device of FIG. 7 additionally has a delayer 170 compared with the semiconductor memory device of FIG. 1. The delayer 170, which has a plurality of buffers or inverters, receives the active signal ACT and activates a level changing signal LS by delaying the active signal ACT for a predetermined time. A point in time at which the level changing signal LS is activated is set to be after data of the bit-line pairs BL1/BL1, BL1/BL1, ... BLn/BLn is amplified to a sensing voltage level.

The delayer 170 may be additionally included, or one of many delay circuits that are prepared in the semiconductor memory device may be selected and used. For example, a signal may be extracted from an intermediate node of a row active time (tRAS) delay circuit, which receives the active signal ACT, delays the active signal ACT for a tRAS signal portion and outputs the delayed active signal ACT, to be used as the level changing signal LS.

The column decoder 160 of FIG. 7 outputs a column selection signal having the level of a first reference voltage VREF1 through the column selection lines CSL0, CSL1, ... CSLn in a part of the active signal portion of the column enable signal PCSLE in which the level changing signal LS is in an inactive state. Also, the column decoder 160 outputs a column selection signal having the level of a second reference voltage VREF2 through the column selection lines CSL0, CSL1, ... CSLn in a part of the active signal portion of the column enable signal PCSLE in which the level changing signal LS is in an active state. Here, the second reference voltage VREF2 is set to a higher level than the first reference voltage VREF1. Although not shown in the drawing, the semiconductor memory device may additionally include a reference voltage generator that receives an external power supply voltage and generates the first and second reference voltages VREF1, VREF2 by dividing the voltage.

The I/O gates IOG10, IOG20, IOG11, IOG21, ... IOG1n, IOG2n adjust the amount of charge shared between the bit-line pairs BL0/BL0, BL1/BL1, ... BLn/BLn and the corresponding I/O line pairs IO0/IO0, IO1/IO1, ... IOn/IOn according to the voltage level of a column selection signal applied through the corresponding column selection lines CSL0, CSL1, ... CSLn.

To be more specific, the level changing signal LS is in the inactive state before data of the bit-line pairs BL0/BL0, BL1/BL1, ... BLn/BLn is amplified to a sensing voltage level, and thus the column decoder 160 outputs a column selection signal having the level of the first reference voltage VREF1. Thus, the I/O gates IOG10, IOG20, IOG11, IOG21, ... IOG1n, IOG2n limit charge shared between the bit-line pairs BL0/BL0, BL1/BL1, ... BLn/BLn and the I/O line pairs IO0, /IO0, IO0/IO0, Ion/IOn to a small amount. On the other hand, the level changing signal LS is activated after data of the bit-line pairs BL0/BL0, BL1/BL1, ... BLn/BLn is completely amplified to the sensing voltage level, and thus the column decoder 160 outputs a column selection signal having the level of the second reference voltage VREF2. As a result, the I/O gates IOG10, IOG20, IOG11, IOG21, ... IOG1n, IOG2n increase the amount of charge shared between the bit-line pairs BL0/BL0, BL1/BL1, ... BLn/BLn and the I/O line pairs IO0/IO0, IO1/IO1, ... IOn/IOn in response to the column selection signal.

As described above, before data of the bit-line pairs BL0/BL0, BL1/BL1, ... BLn/BLn is completely amplified to the sensing voltage level, charge shared through the I/O gates IOG10, IOG20, IOG11, IOG21, ... IOG1n, IOG2n is limited to a small amount, thereby preventing a malfunction in which the polarity of the data is changed because the electric potential of the bit-line pairs BL0/BL0, BL1/BL1, ... BLn/BLn is changed by the I/O line pairs IO0/IO0, IO1/IO1, ... IOn/IOn driven to a relatively high voltage level.

Figure 8:
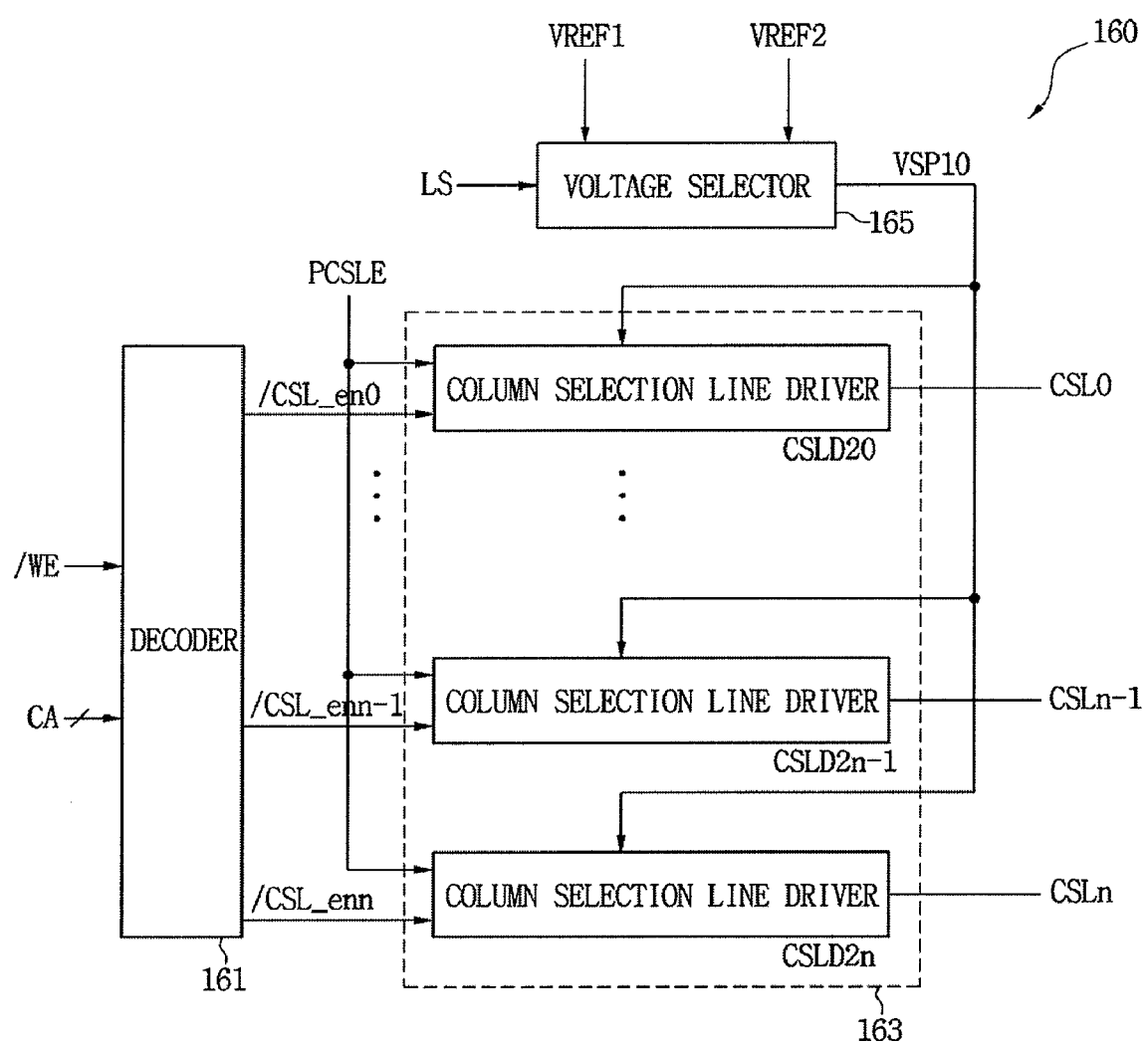
FIG. 8 is a block diagram of an exemplary embodiment of a column decoder of FIG. 7.

FIG. 8 is a block diagram of an exemplary embodiment of the column decoder 160 of FIG. 7.

The column decoder 160 of FIG. 8 includes a decoder 161, a driver unit 163, and a voltage selector 165.

The decoder 161 decodes the column address CA in response to the write enable signal/WE, and selectively activates at least one of a plurality of column selection line enable signals/CSL_en0, /CSL_en1, ... /CSL_enn. In the exemplary embodiment the decoder 161 can include the column selection line enable signal generator 63-1 of FIG. 3. However, this exemplary embodiment does not require that a read column enable signal/RCSL_eni and a write column enable signal WCSL_eni be generated, so that a column selection line enable signal generator may have a different structure than that shown in FIG. 3. Alternatively, the decoder 161 may generate the read column enable signal/RCSL_eni and the write column enable signal WCSL_eni. The voltage selector 165 receives the first reference voltage VREF1 and the second reference voltage VREF2 and generates a supply voltage VSP10 having the level of the first reference voltage VREF1 when the level changing signal LS is in the inactive state and the supply voltage VSP10 having the level of the second reference voltage VREF2 when the level changing signal LS is in the active state. Like the driver unit 63 of FIG. 2, the driver unit 163 has a plurality of column selection line drivers CSLD20, CSLD21, ... CSLD2n, and the respective column selection line drivers CSLD20, CSLD21, ... CSLD2n drive the column selection lines CSL0, CSL1, ... CSLn to the supply voltage VSP10 in response to the activation of the corresponding column selection line enable signals/CSL_en0, /CSL_en1, ... /CSL_enn. Thus, a column selection signal is activated to the level of the supply voltage VSP10.

Figure 9:
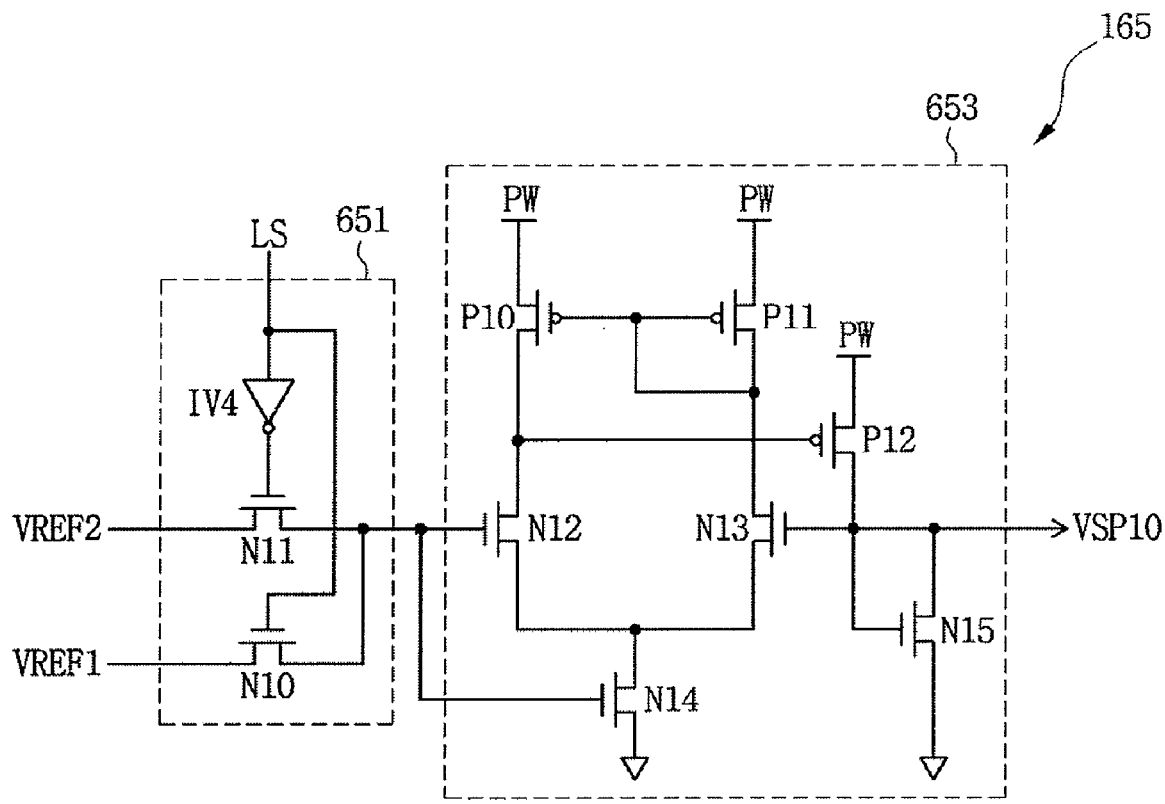
FIG. 9 is a circuit diagram of a voltage selector of FIG. 8.

FIG. 9 is a circuit diagram of the voltage selector 165 of FIG. 8.

The voltage selector 165 may include a switch 651 and a differential amplifier 653. The switch 651 includes an NMOS transistor N10 that is turned on and outputs the first reference voltage VREF1 when the level changing signal LS is deactivated to a high level, and an NMOS transistor N11 that is turned on and outputs the second reference voltage VREF2 when the level changing signal LS is activated to a low level. The differential amplifier 653 may be a general differential amplifier circuit.

The operation of the voltage selector 165 will now be described.

When the level changing signal LS is deactivated, the switch 651 outputs the first reference voltage VREF1, and the differential amplifier 653 generates the supply voltage VSP10 that is set to the level of the first reference voltage VREF1. On the other hand, when the level changing signal LS is activated, the switch 651 outputs the second reference voltage VREF2, and the differential amplifier 653 generates the supply voltage VSP10 that is set to the level of the second reference voltage VREF2. In other words, the voltage selector 165 outputs the supply voltage VSP10 that is set to the level of the first reference voltage VREF1 or the second reference voltage VREF2 according to the level of the level changing signal LS.

Here, the voltage selector 165 receives a power supply voltage PW regardless of the read or write operation. Depending on the semiconductor memory device, an internal power supply voltage or external power supply voltage is used as the power supply voltage PW.

Figure 10:
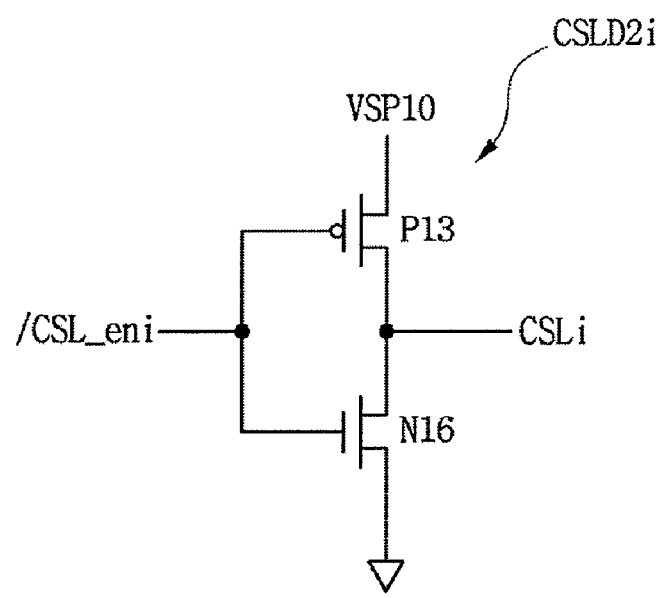
FIG. 10 is a circuit diagram of an exemplary embodiment of a column selection line driver of FIG. 8.

FIG. 10 is a circuit diagram of an exemplary embodiment of a column selection line driver CSLD2$i$ of FIG. 8.

As shown in FIG. 10, the column selection line driver CSLD2$i$ includes a PMOS transistor P13 that pull-up drives the corresponding column selection line CSL$i$ in response to the corresponding column selection line enable signal/CSL_en$i$, and an NMOS transistor N16 that pull-down drives the corresponding column selection line CSL$i$ in response to the corresponding column selection line enable signal/CSL_en$i$.

The column selection line driver CSLD2$i$ pull-up drives the corresponding column selection line CSL$i$ to the supply voltage VSP10 through the PMOS transistor P13 when the corresponding column selection line enable signal/CSL_en$i$ is activated to a low level. Meanwhile, when the column selection line enable signal/CSL_en$i$ is deactivated to a high level, the corresponding column selection line CSL$i$ is pull-down driven by the NMOS transistor N16.

Thus, the column decoder 160 of the semiconductor memory device shown in FIG. 7 receives the first and second reference voltages VREF1, VREF2 and generates the single supply voltage VSP10 that is diversified into the level of the first reference voltage VREF1 and the level of the second reference voltage VREF2 according to the level of the level changing signal LS. Also, the column decoder 160 decodes the column address CA and drives the column selection lines CSL0, CSL1, ... CSLn to the level of the supply voltage VSP10.

Figure 11:
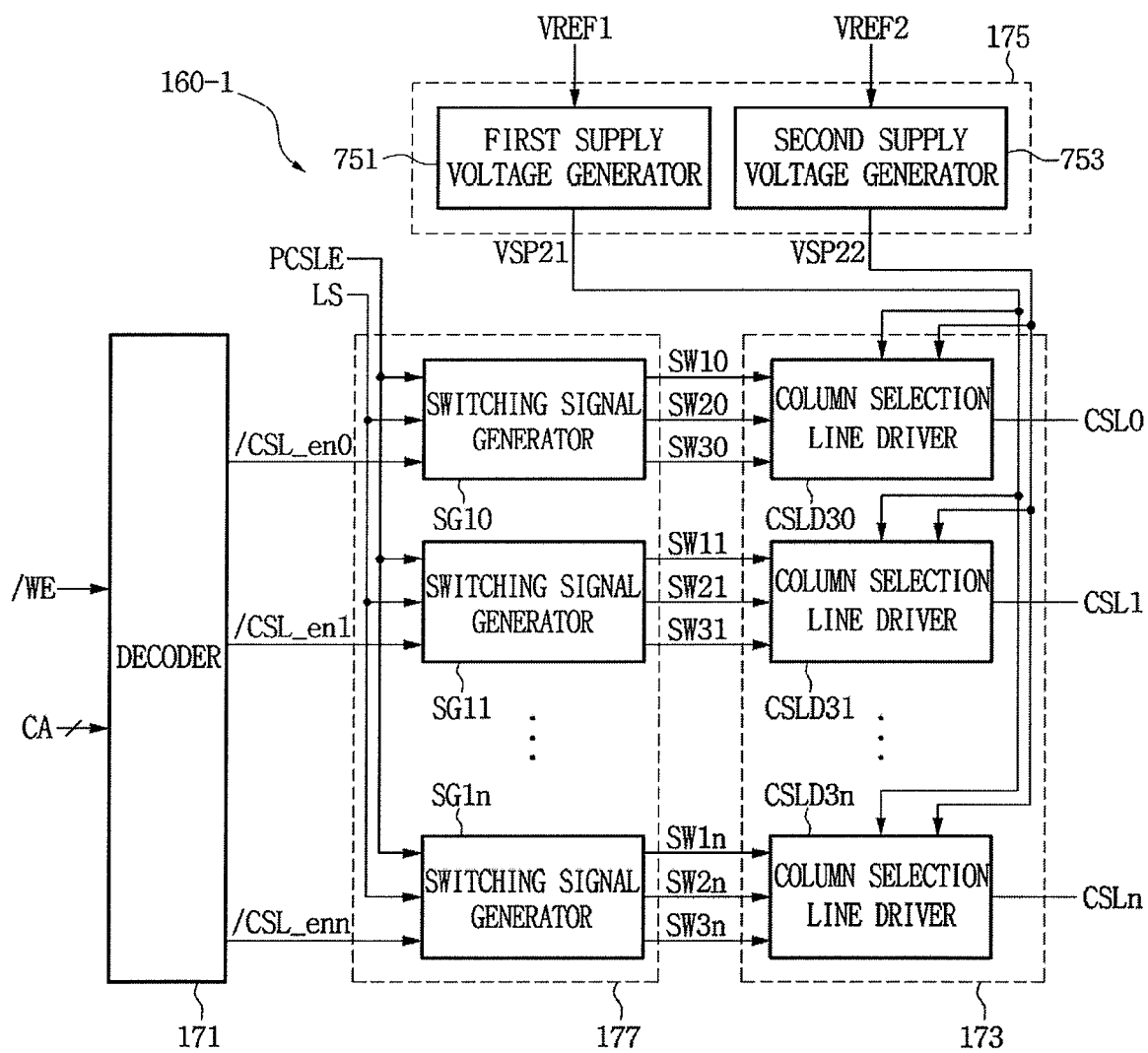
FIG. 11 is a block diagram of an exemplary embodiment of the column decoder of FIG. 7.

FIG. 11 is a block diagram of another exemplary embodiment of the column decoder 160 of FIG. 7.

The column decoder 160-1 of FIG. 11 includes a decoder 171, a switching signal unit 177, a supply voltage generation unit 175, and a driver unit 173.

The decoder 171 decodes the column address CA in response to the write enable signal/WE and activates at least one of a plurality of column selection line enable signals/CSL_en0, /CSL_en1, ... /CSL_enn. Like the decoder 161 of FIG. 8, the decoder 171 of FIG. 11 may include the column selection line enable signal generator 63-1 of FIG. 3, but the column selection line enable signal generator may have a different structure than that shown in FIG. 3.

The switching signal unit 177 includes a plurality of switching signal generators SG10, SG11, ... SG1$n$ that receive the column selection line enable signals /CSL_en0, /CSL_en1, ... /CSL_enn, respectively. In response to the activated column selection line enable signals/CSL_en0, /CSL_en1, ... /CSL_enn, the switching signal unit 177 activates second switching signals SW20, SW21, ... SW2$n$ to a low level when the level changing signal LS is in the inactive state in the active signal portion of the column enable signal PCSLE, and activates third switching signals SW30, SW31, ... SW3$n$ to a low level when the level changing signal LS is in the active state. Meanwhile, first signals SW10, SW11, ... SW1$n$ are activated to a high level when the column enable signal PCSLE is in the inactive state.

The supply voltage generation unit 175 includes a first supply voltage generator 751 that receives the first reference voltage VREF1 and generates a first supply voltage VSP21 set to the level of the first reference voltage VREF1, and a second supply voltage generator 753 that receives the second reference voltage VREF2 and generates a second supply voltage VSP22 set to the level of the second reference voltage VREF2.

The driver unit 173 receives the first and second supply voltages VSP21, VSP22. When the first switching signals SW10, SW11, ... SW1$n$ are activated, the driver unit 173 pull-down drives the column selection lines CSL0, CSL1, ... CSLn to the ground voltage and generates a deactivated column selection signal. Also, when the second switching signals SW20, SW21, ... SW2$n$ are activated, the driver unit 173 pull-up drives the column selection lines CSL0, CSL1, ... CSLn to the first supply voltage VSP21 and generates a column selection signal activated to the level of the first supply voltage VSP21. Further, when the third switching signals SW30, SW31, ... SW3$n$ are activated, the driver unit 173 pull-up drives the column selection lines CSL0, CSL1, ... CSLn to the second supply voltage VSP22 and generates a column selection signal activated to the level of the second supply voltage VSP22. the driver unit 173 has a plurality of column selection line drivers CSLD30, CSLD31, ... CSLD3$n$ that drive the corresponding column selection lines CSL0, CSL1, ... CSLn respectively.

Figure 12:
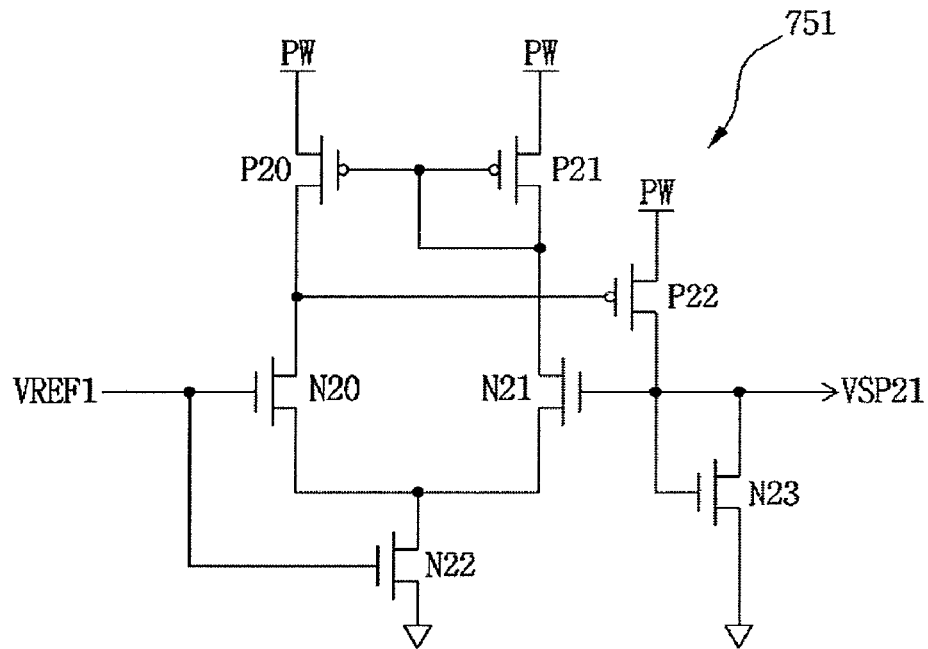
FIG. 12 is a circuit diagram of a first supply voltage generator.
Figure 13:
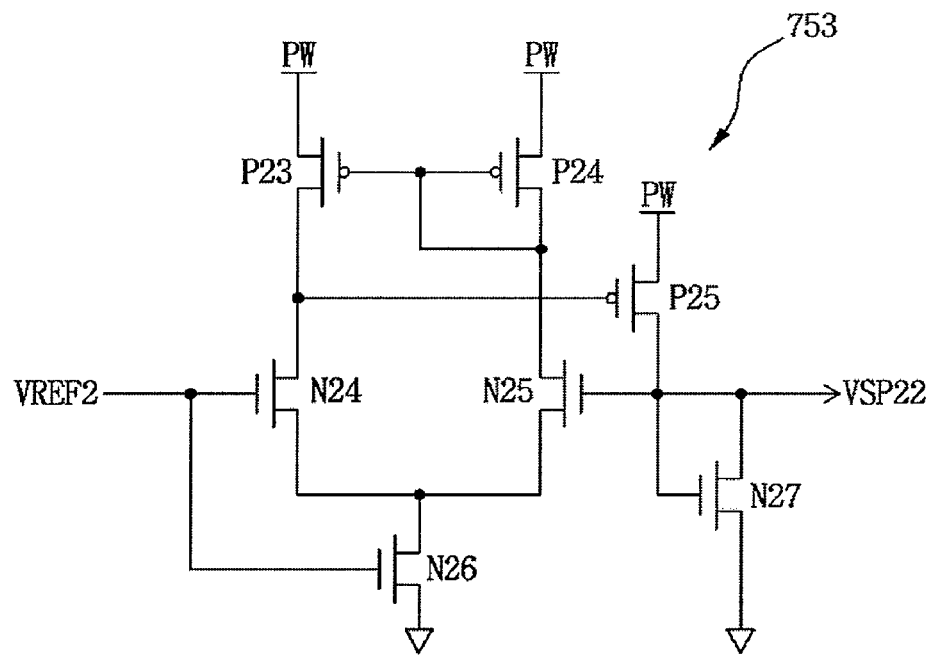
FIG. 13 is a circuit diagram of a second supply voltage generator.

FIG. 12 is a circuit diagram of the first supply voltage generator 751, and FIG. 13 is a circuit diagram of the second supply voltage generator 753.

As shown in FIG. 12, the first supply voltage generator 751 may be a general differential amplifier circuit. The first supply voltage generator 751 receives the first reference voltage VREF1 and generates the first supply voltage VSP21 set to the level of the first reference voltage VREF1. As shown in FIG. 13, the second supply voltage generator 753 may also be a general differential amplifier circuit. The second supply voltage generator 753 receives the second reference voltage VREF2 and generates the second supply voltage VSP22 set to the level of the second reference voltage VREF2.

Like the voltage selector 165 of FIG. 9, the first supply voltage generator 751 and the second supply voltage generator 753 receive a power supply voltage PW regardless of the read or write operation. Depending on the semiconductor memory device, an internal power supply voltage or an external power supply voltage is used as the power supply voltage PW.

Figure 14:
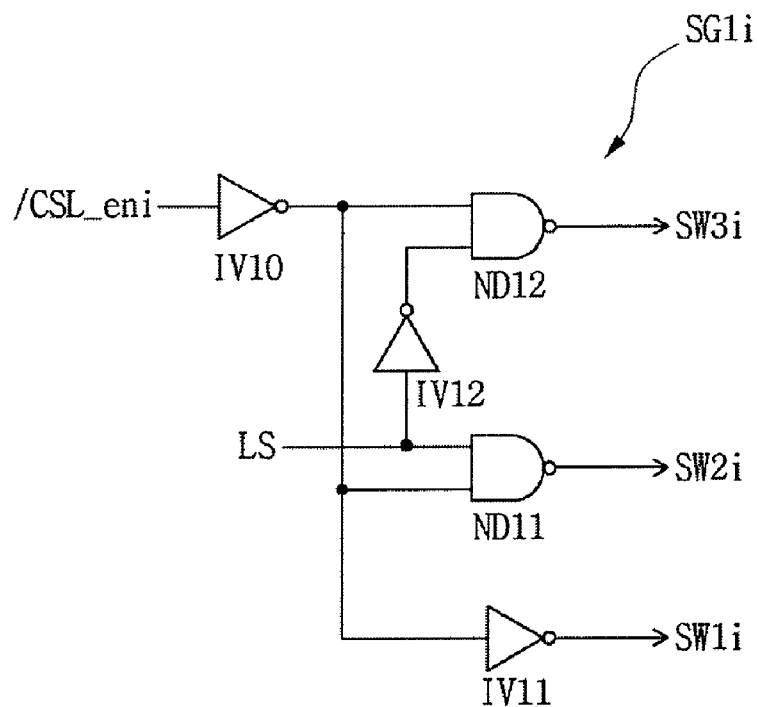
FIG. 14 is a circuit diagram of an exemplary embodiment of a switching signal generator.

FIG. 14 is a circuit diagram of an exemplary embodiment of a switching signal generator SGL$i$.

The switching signal unit 177 includes a plurality of switching signal generators SG10, SG11, ... SG1$n$. As shown in FIG. 14, each switching signal generator SG1$i$ includes an inverter IV10 that inverts the column selection line enable signal/CSL_en$i$ and outputs the inverted column selection line enable signal, an inverter IV11 that inverts the output signal of the inverter IV10 and generates a first switching signal SW1$i$, a NAND gate ND11 that performs a NAND operation on the output signal of the inverter IV10 and the level changing signal LS and generates a second switching signal SW2$i$, an inverter IV12 that inverts the level changing signal LS and outputs the inverted level changing signal, and a NAND gate ND12 that performs a NAND operation on the output signal of the inverter IV10 and the inverted level changing signal and generates a third switching signal SW3i.

Figure 15:
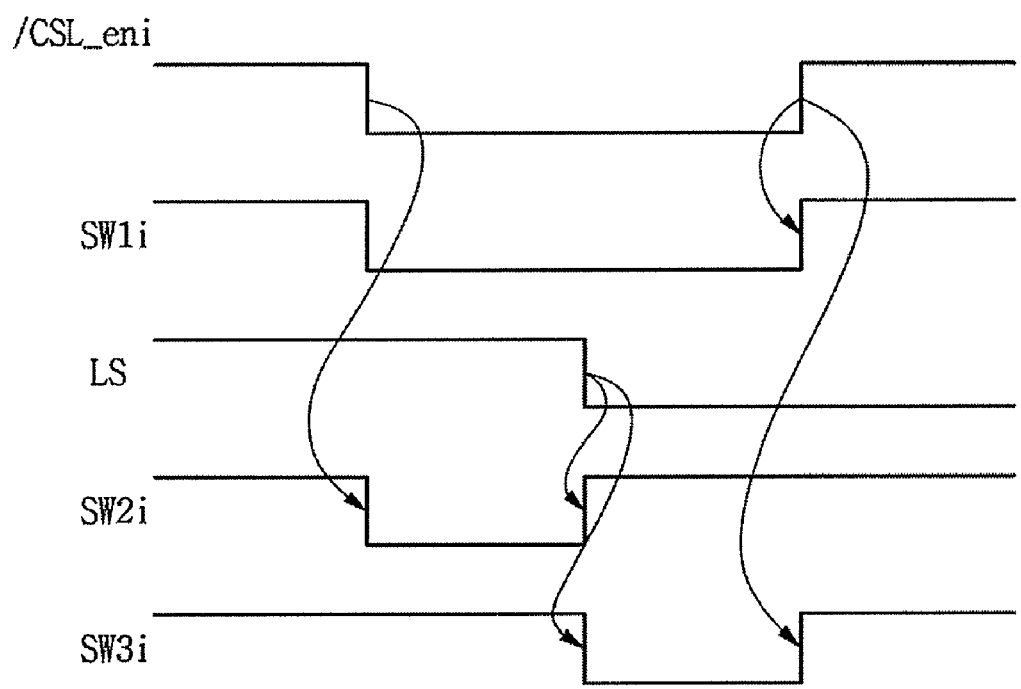
FIG. 15 is a timing diagram illustrating the operation of the switching signal generator of FIG. 14.

The operation of the switching signal generator SG1i having the above-described structure will now be described with reference to FIG. 15.

When the corresponding column selection line enable signal/CSL_eni is activated to a low level, the first switching signal SW1i of the switching signal generator SG1i is switched to a low level. When the column selection line enable signal/CSL_eni is activated to a low level and the level changing signal LS is at a high level in the inactive state, the second switching signal SW2i is activated to a low level. On the other hand, when the column selection line enable signal/CSL_eni is activated to a low level and the level changing signal LS is at a low level in the active state, the third switching signal SW3i is activated to a low level. In other words, the switching signal generator SG1i selectively activates the second switching signal SW2i or the third switching signal SW3i according to the level of the level changing signal LS in the active signal portion of the corresponding column selection line enable signal/CSL_eni. Meanwhile, in the inactive signal portion of the corresponding column selection line enable signal/CSL_eni, the first switching signal SW is activated at a high level.

Figure 16:
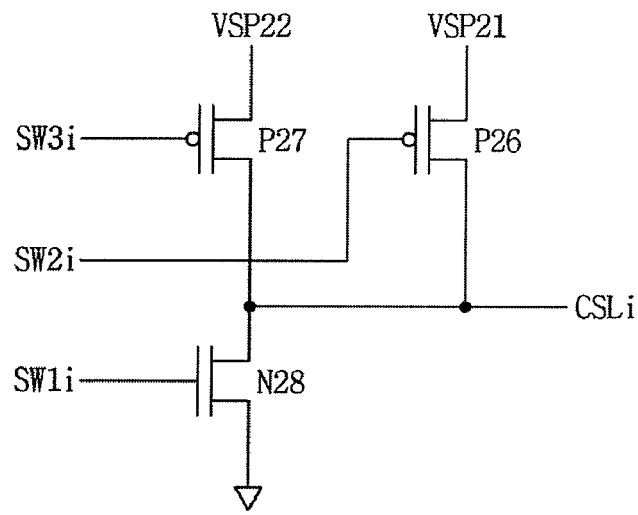
FIG. 16 is a circuit diagram of a column selection line driver.

FIG. 16 is a circuit diagram of a column selection line driver CSLD3i.

The driver unit 173 has the column selection line drivers CSLD30, CSLD31, . . . CSLD3n. Each column selection line driver CSLD3i includes an NMOS transistor N28 that pull-down drives the corresponding column selection line CSLi to the ground voltage in response to the first switching signal SW1i, a PMOS transistor P26 that pull-up drives the column selection line CSLi to the first supply voltage VSP21 in response to the second switching signal SW2i, and a PMOS transistor P27 that pull-up drives the column selection line CSLi to the second supply voltage VSP22 in response to the third switching signal SW3i.

In the active signal portion of the second switching signal SW2i, the column selection line driver CSLD3i pull-up drives the column selection line CSLi and generates a column selection signal activated to the level of the first supply voltage VSP21. In the active signal portion of the third switching signal SW3i, the column selection line driver CSLD3i pull-up drives the column selection line CSLi and generates a column selection signal activated to the level of the second supply voltage VSP22. In other words, the column selection line driver CSLD3i drives the column selection line CSLi to the level of the first supply voltage VSP21 in a signal portion in which data of a bit-line pair is not amplified to a sensing voltage level, and drives the column selection line CSLi to the level of the second supply voltage VSP22 after the data of the bit-line pair is amplified to the sensing voltage level.

Figure 17:
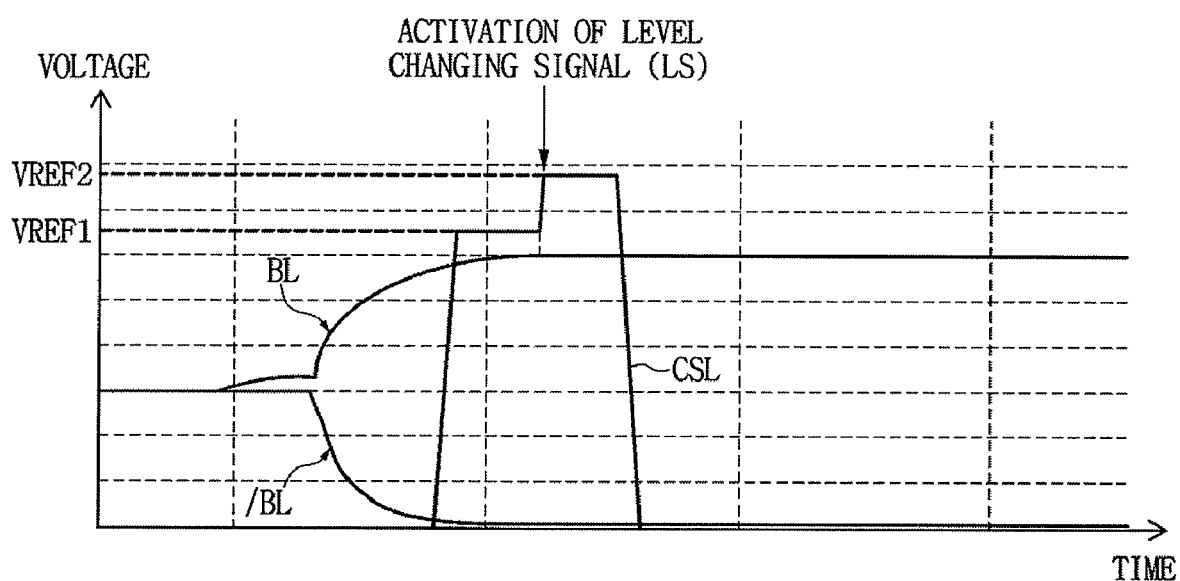
FIG. 17 is timing diagram illustrating the operation of the semiconductor memory device of FIG. 7.

FIG. 17 is an operational timing diagram illustrating the operation of the semiconductor memory device of FIG. 7 when implementing the column decoder 160-1 depicted in FIG. 11.

When the column selection line enable signal/CSL_eni is at a high level in the inactive state, the switching signal unit 177 activates the corresponding first switching signal SW1i to a high level, and the column selection line driver CSLD3i drives the corresponding column selection line CSLi to the ground voltage. Thus, the column selection line CSLi has the ground voltage level, and the corresponding I/O gates are turned off.

After this, when the column selection line enable signal/CSL_eni is activated to a low level and data of the corresponding memory cell MC is carried on a bit-line pair BLi/BLi, a sense amplifier unit 120 senses and amplifies the data of the bit-line pair BLi/BLi. However, before the data of the bit-line pair BLi/BLi is amplified to the sensing voltage level, the level changing signal LS is in the inactive state, and thus the switching signal unit 177 activates the second switching signal SW2i in response to the column selection line enable signal/CSL_eni and the level changing signal LS. Thus, the column selection line driver CSLD3i drives the column selection line CSLi to the level of the first supply voltage VSP21 in the active signal portion of the corresponding second switching signal SW2i. The I/O gates limit the amount of charge shared between the bit-line pair BLi/BLi and the I/O line pair IOi/IOi to a small amount in response to the first supply voltage VSP21 applied to the column selection line CSLi. In other words, a data transfer rate between the bit-line pair BLi/BLi and the I/O line pair IOi/IOi is limited to a predetermined value or less. Thus, it is possible to transfer the data between the bit-line pair BLi/BLi and the I/O line pair IOi/IOi while preventing the polarity of the data from being changed because a small difference in electric potential between the bit-line pair BLi/BLi is inverted by charge of the I/O line pair IOi/IOi.

After the data of the bit-line pair BLi/BLi is completely amplified to the sensing voltage level, the level changing signal LS is activated, and thus the switching signal unit 177 activates the third switching signal SW3i in response to the column selection line enable signal/CSL_eni and the level changing signal LS. The column selection line driver CSLD3i drives the column selection line CSLi to the level of the second supply voltage VSP22 in the active signal portion of the third switching signal SW3i. The I/O gates increase the amount of charge shared between the bit-line pair BLi/BLi and the I/O line pair IOi/IOi in response to the second supply voltage VSP22 applied to the column selection line CSLi, thereby increasing a data transfer rate between the bit-line pair BLi/BLi and the I/O line pair IOi/IOi.

In brief, the semiconductor memory device according to exemplary embodiments drives a column selection line CSLi to one of two voltage levels according to the degree of amplification of data of a bit-line pair BLi/BLi, and adjusts a data transfer rate between the bit-line pair BLi/BLi and the I/O line pair IOi/IOi through I/O gates in response to the voltage applied to the column selection line CSLi. Thus, it is possible to stably perform a read operation without a malfunction such as inversion of data polarity and to advance a point in time at which the column enable signal/CSL_eni is activated, so that the operating speed of the semiconductor memory device can be increased.

Figure 18:
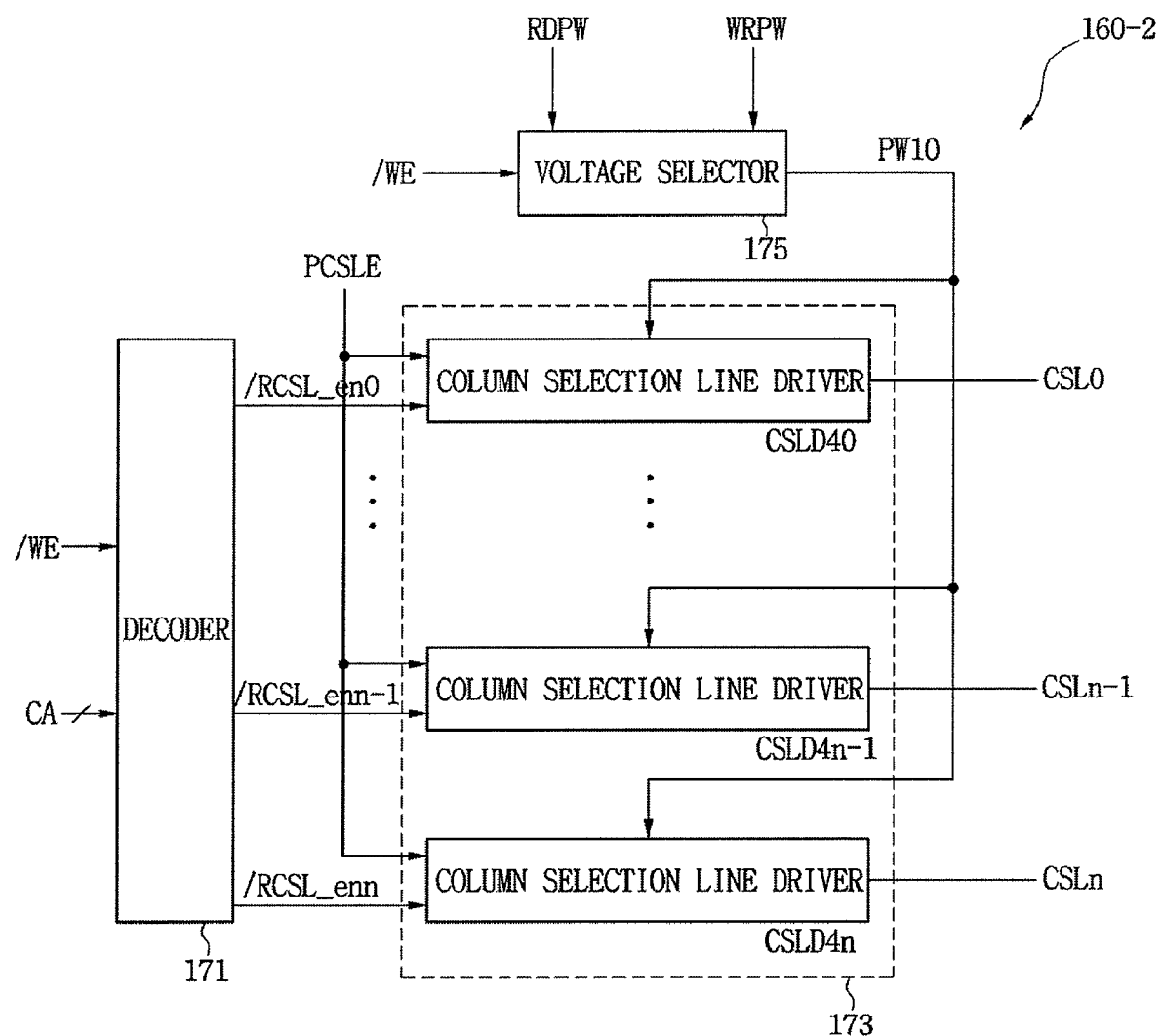
FIG. 18 is a block diagram of an exemplary embodiment of the column decoder of FIG. 1.

FIG. 18 is a block diagram of another exemplary embodiment of the column decoder 60 of FIG. 1.

In the column decoder 60 shown in FIG. 2, each of the column selection line drivers CSLD10, CSLD11, . . . CSLD1n of the driver unit 63 directly receives the read power supply voltage RDPW and the write power supply voltage WRPW, selects one of the read power supply voltage RDPW and the write power supply voltage WRPW, and drives the column selection line CSLi to the level of the selected power supply voltage. However, a column decoder 160-2 of FIG. 18 has a voltage selector 175, like the column decoder 160 of FIG. 8. In response to the write enable signal/WE applied from the command decoder 40, the voltage selector 175 of FIG. 18 selects the read power supply voltage RDPW or the write power supply voltage WRPW and applies a driver power supply voltage PW10 to each of column selection line drivers CSLD40, CSLD41, ... CSLD4n. In other words, since the driver power supply voltage PW10 applied to the column selection line drivers CSLD40, CSLD41, ... CSLD4n is selected in advance by the voltage selector 175 according to the read or write operation, each of the column selection line drivers CSLD40, CSLD41, ... CSLD4n of FIG. 18 may have the same structure as the column selection line drivers CSLD20, CSLD21, ... CSLD2n of the driver unit 163 shown in FIG. 8. Thus, the respective column selection line drivers CSLD40, CSLD41, ... CSLD4n may have a simpler structure than the column selection line driver CSLDi of FIG. 3.

Since the voltage selector 175 of FIG. 18 may be implemented in various forms, such as the voltage selector 165 of FIG. 8, the voltage selector 175 will not be illustrated further in the drawings.

In the drawings, the voltage selectors 165, 175 are included in the column decoders 160, 160-2, respectively. However, the voltage selectors 165, 175 may be disposed outside of the column decoders 160, 160-2, respectively. Also, as described above, the decoders 61, 161 of the column decoders 60, 160 may be configured to output the read column enable signal/RCSL_eni, the write column enable signal/WCSL_eni, and the column selection line enable signal/CSL_eni. In this case, the column selection line drivers CSLD10, CSLD11, CSLD1n and CSLD20, CSLD21, ... CSLD2n do not need to have a component for generating the read column enable signal/RCSL_eni, the write column enable signal/WCSL_eni, and the column selection line enable signal/CSL_eni. Furthermore, the write enable signal/WE is directly applied to the voltage selector 175 in the column decoder 160-2 of FIG. 18, and thus the column decoder 160-2 does not need to generate the read column enable signal/RCSL_eni and the write column enable signal /WCSL_eni for selecting the read power supply voltage RDPW or the write power supply voltage WRPW.

Figure 19:
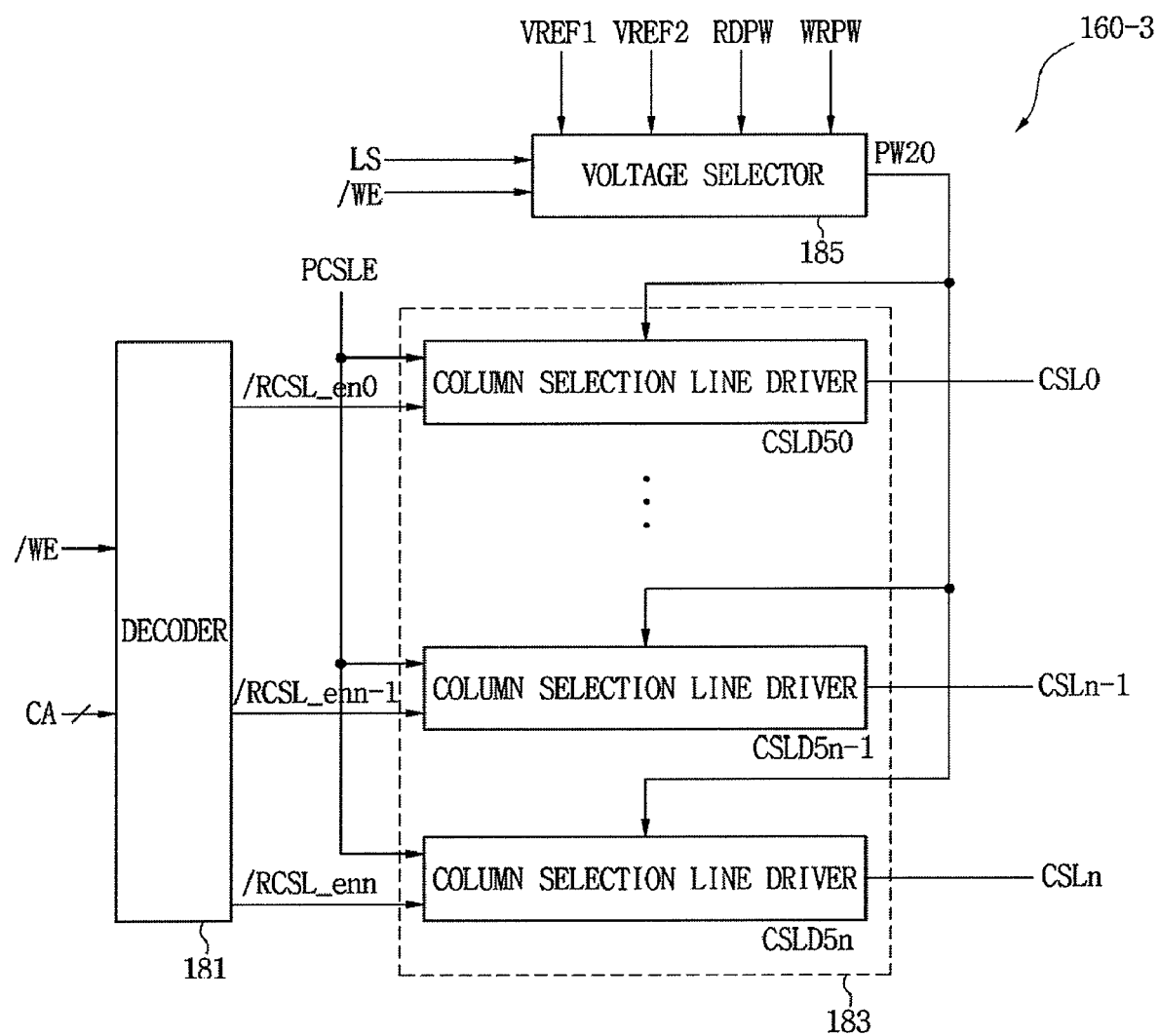
FIG. 19 is a block diagram of an exemplary embodiment of the column decoder.

FIG. 19 is a block diagram of an exemplary column decoder 160-3. As with the column decoder 160-1 of FIG. 18, a voltage selector 185 in the column decoder 160-3 of FIG. 19 selects the read power supply voltage RDPW or the write power supply voltage WRPW according to the read or write operation in response to the write enable signal/WE and applies the selected power supply voltage to each of column selection line drivers CSLD50, CSLD51, ... CSLD5n. Also, as with the voltage selector 165 of FIG. 8, the voltage selector 185 of FIG. 19 receives the level changing signal LS and the first and second reference voltages VREF1, VREF2, and applies the read power supply voltage RDPW diversified into two levels to the column selection line drivers CSLD50, CSLD51, ... CSLD5n during the read operation. As a result, the voltage selector 185 of FIG. 19 selects the read power supply voltage RDPW and the write power supply voltage WRPW having different levels during the read and write operations, and during the read operation, diversifies the read power supply voltage RDPW into two levels and applies the read power supply voltage RDPW to the respective column selection line drivers CSLD50, CSLD51, ... CSLD5n. Thus, the respective column selection line drivers CSLD50, CSLD51, ... CSLD5n drive the corresponding column selection lines CSL0, CSL1, ... CSLn to the read power supply voltage RDPW as diversified into two levels during the read operation, and to the write power supply voltage WRPW having a different level than the read power supply voltage RDPW during the write operation.

In the above description, the read power supply voltage RDPW is shown as being diversified into two levels during the read operation. However, the write power supply voltage WRPW may also be diversified into two levels. To diversify the write power supply voltage WRPW into two levels, an additional reference voltage other than the first and second reference voltages VREF1, VREF2 may be applied. Alternatively, the first reference voltage VREF1 may be used as a reference voltage for diversifying the read power supply voltage RDPW into two levels, and the second reference voltage VREF2 may be used as a reference voltage for diversifying the write power supply voltage WRPW into two levels.

In the above description, the read power supply voltage RDPW and the write power supply voltage WRPW are diversified into two levels during the read or write operation, but an additional reference voltage may be received to diversify and gradually increase the levels of the read power supply voltage RDPW and the write power supply voltage WRPW.

The activation and deactivation levels of each of the above-mentioned signals may be adjusted.

As described above, a semiconductor memory device according to at least one of the exemplary embodiments can change the voltage level of a column selection line according to a read or write operation. Thus, taking into consideration the use of the semiconductor memory device, a column selection line can be driven to different voltage levels, and the operating speed of the semiconductor memory device can be stably increased. Also, by activating a column selection line to one of two voltage levels, a data transfer rate through an I/O gate between a bit-line pair and an I/O line is adjusted, thereby performing a stable read operation regardless of the degree of amplification of the bit-line pair. Furthermore, a point in time at which the column selection line is activated can be advanced, and thus the operating speed may increase.

Although practical exemplary embodiments have been described, those skilled in the art will readily appreciate that many modifications are possible in exemplary embodiments without materially departing from the novel teachings and advantages. Therefore, it is to be understood that the foregoing is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
a memory cell array having a plurality of memory cells connected between respective word lines and bit-line pairs;
a sense amplifier unit having a plurality of sense amplifiers connected with the bit-line pairs respectively and configured to amplify data of the bit-line pairs to a sensing voltage level;
a command decoder configured to decode a command applied from the outside and to output a decoded command;
a plurality of input/output (I/O) gates configured to electrically connect the bit-line pairs with corresponding I/O line pairs in response to a voltage level applied through corresponding column selection lines; and
a column decoder configured to decode a column address in response to the decoded command and to drive at least one of the column selection lines to a plurality of different voltages levels according to read and write operations.

2. The semiconductor memory device of claim 1, wherein the column decoder includes:
a decoder configured to selectively activate at least one of a plurality of read column selection signals or one of a plurality of write column selection signals in response to the column address and a write enable signal applied from the command decoder; and a driver unit having a plurality of column selection line drivers each configured to drive a corresponding one of the column selection lines to a level of a read power supply voltage or a level of a write power supply voltage in response to a corresponding one of the read column selection signals, a corresponding one of the write column selection signals, and a column enable signal.

3. The semiconductor memory device of claim 2, wherein each of the column selection line drivers includes:

a column selection line enable signal generator configured to output a read column enable signal, a write column enable signal, and a column selection line enable signal in response to the corresponding read column selection signal, the corresponding write column selection signal, and the column enable signal; and a column selection line driving unit configured to drive the corresponding column selection line to the level of the read power supply voltage or to the level of the write power supply voltage in response to the read column enable signal, the write column enable signal, and the column selection line enable signal.

4. The semiconductor memory device of claim 3, wherein the column selection line enable signal generator includes:

a first inverter configured to invert the corresponding read column selection signal;

a second inverter configured to invert the corresponding write column selection signal;

a first NAND gate configured to perform a NAND operation on an output signal of the first inverter and the column enable signal and to output the read column enable signal;

a second NAND gate configured to perform a NAND operation on an output signal of the second inverter and the column enable signal and to output the write column enable signal; and an AND gate configured to perform an AND operation on the read column enable signal and the write column enable signal and to output the column selection line enable signal.

5. The semiconductor memory device of claim 4, wherein the column selection line driving unit includes:

a read driver configured to receive the read power supply voltage in response to the read column enable signal and to drive the corresponding column selection line to the level of the read power supply voltage;

a write driver configured to receive the write power supply voltage in response to the write column enable signal and to drive the corresponding column selection line to the level of the write power supply voltage; and a deactivator configured to drive the corresponding column selection line to a ground voltage level in response to the column selection line enable signal.

6. The semiconductor memory device of claim 5, wherein:

the read driver has a first p-type metal oxide semiconductor (PMOS) transistor connected between the read power supply voltage and the corresponding column selection line and is configured to receive the corresponding read column selection signal through a gate, and the write driver has a second PMOS transistor connected between the write power supply voltage and the corresponding column selection line and is configured to receive the corresponding write column selection signal through a gate.

7. The semiconductor memory device of claim 6, wherein the second PMOS transistor has a first gate and a second gate extending in a direction of the bit-line pairs and disposed in parallel in a direction of the word lines, and a third gate configured to connect one end of the first gate with one end of the second gate on a substrate, and the first PMOS transistor has a fourth gate and a fifth gate extending in the direction of the bit-line pairs and disposed in parallel in the direction of the word lines, and a sixth gate configured to connect one end of the fourth gate with one end of the fifth gate on the substrate.

8. The semiconductor memory device of claim 7, wherein the first PMOS transistor and the second PMOS transistor include:

a source of the first PMOS transistor formed between the fourth gate and the fifth gate in the substrate, and configured to receive the read power supply voltage;

a first drain and a second drain of the first PMOS transistor and the second PMOS transistor respectively formed between the first gate and the fourth gate and between the second gate and the fifth gate in the substrate and connected with the corresponding column selection line; and a first source and a second source of the second PMOS transistor respectively formed on opposite sides of the first drain and the second drain with respect to the first gate and the second gate in the substrate, and configured to receive the write power supply voltage.

9. The semiconductor memory device of claim 8, wherein the read power supply voltage is an internal power supply voltage, and the write power supply voltage is an external power supply voltage having a higher level than the internal power supply voltage.

10. The semiconductor memory device of claim 5, wherein the read driver includes:

a first control p-type metal oxide semiconductor (PMOS) transistor connected between an internal power supply voltage and a first node, and configured to receive a first control signal through a gate;

a second control PMOS transistor connected between an external power supply voltage and the first node, and configured to receive a second control signal through a gate; and a first PMOS transistor connected between the first node and the corresponding column selection line, and configured to receive the corresponding read column selection signal through a gate.

11. The semiconductor memory device of claim 10, wherein the write driver includes:

a third control PMOS transistor connected between the external power supply voltage and a second node, and configured to receive a third control signal through a gate;

a fourth control PMOS transistor connected between the internal power supply voltage and the second node, and configured to receive a fourth control signal through a gate; and a second PMOS transistor connected between the second node and the corresponding column selection line, and configured to receive the corresponding write column selection signal through a gate.

12. The semiconductor memory device of claim 11, wherein the first control signal, the second control signal, the third control signal and the fourth control signal are designated by setting a mode register set signal from outside of the semiconductor memory device.

13. The semiconductor memory device of claim 1, wherein the column decoder includes:

a decoder configured to selectively activate at least one of a plurality of column selection line enable signals in response to the column address;

a voltage selector configured to select and to output a read power supply voltage or a write power supply voltage in response to a write enable signal applied from the command decoder; and a driver unit having a plurality of column selection line drivers each configured to drive a corresponding one of the column selection lines to a level of the read power supply voltage or the write power supply voltage in response to a corresponding one of the column selection line enable signals.

14. The semiconductor memory device of claim 1, further comprising a delayer configured to receive an active signal from the command decoder, to delay the active signal, and to output a level changing signal.

15. The semiconductor memory device of claim 14, wherein the column decoder includes:

a decoder configured to decode the column address and to selectively activate at least one of a plurality of coding signals;

a voltage selector configured to generate the supply voltage having the level of the first reference voltage when the level changing signal is deactivated and the supply voltage having the level of the second reference voltage when the level changing signal is activated; and a driver unit configured to activate a column selection signal to the level of the supply voltage in an active signal portion of a column enable signal in response to the activated coding signal.

16. The semiconductor memory device of claim 15, wherein the voltage selector includes:

a switch configured to output the first reference voltage when the level changing signal is deactivated and the second reference voltage when the level changing signal is activated; and a differential amplifier configured to generate the supply voltage set to the level of the first reference voltage or the second reference voltage selectively output from the switch.

17. The semiconductor memory device of claim 14, wherein the column decoder includes:

a decoder configured to selectively activate at least one of a plurality of column selection line enable signals in response to the column address;

a supply voltage generator configured to generate a first supply voltage having a level of a first reference voltage and a second supply voltage having a level of a second reference voltage;

a switching signal generator configured to activate a first switching signal when a column selection line enable signal is in an active state and the level changing signal is in an inactive state, and a second switching signal when the column selection line enable signal is in the active state and the level changing signal is in the active state; and a driver unit having a plurality of column selection line drivers each configured to drive a corresponding one of the column selection lines to the level of the first reference voltage in an active signal portion of the first switching signal and to the level of the second supply voltage in an active signal portion of the second switching signal.

18. A semiconductor memory device, comprising:

a memory cell array having a plurality of memory cells connected between respective word lines and bit-line pairs;

a sense amplifier unit having a plurality of sense amplifiers connected with the bit-line pairs respectively and configured to amplify data of the bit-line pairs to a sensing voltage level;

a command decoder configured to decode a command applied from the outside and to output a decoded command;

a plurality of input/output (I/O) gates configured to electrically connect the bit-line pairs with corresponding I/O line pairs in response to a voltage level applied through corresponding column selection lines; and a column decoder configured to decode a column address in response to the decoded command and to drive at least one of the column selection lines to a plurality of different voltages levels, wherein the column decoder includes:

a decoder configured to selectively activate at least one of a plurality of column selection line enable signals in response to the column address;

a voltage selector configured to output a supply voltage whose level varies in response to a level changing signal; and a driver unit having a plurality of column selection line drivers each configured to drive a corresponding one of the column selection lines to the supply voltage applied from the voltage selector in response to a corresponding one of the column selection line enable signals.

19. The semiconductor memory device of claim 18, wherein the voltage selector receives a first reference voltage and a second reference voltage, and outputs the supply voltage with a level of the first reference voltage in a first signal portion in which the level changing signal is in an inactive state and with a level of the second reference voltage in a second signal portion in which the level changing signal is in an active state.

20. The semiconductor memory device of claim 18, further comprising a delayer configured to receive an active signal from the command decoder, to delay the active signal, and to output the level changing signal.

* * * * *